United States Patent
Lee et al.

(10) Patent No.: US 9,406,658 B2
(45) Date of Patent: Aug. 2, 2016

(54) EMBEDDED COMPONENT DEVICE AND MANUFACTURING METHODS THEREOF

(75) Inventors: Chun-Che Lee, Kaohsiung (TW); Yuan-Chang Su, Luzhu Township (TW); Ming Chiang Lee, Kaohsiung (TW); Shih-Fu Huang, Zhudong Township (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 1272 days.

(21) Appl. No.: 12/972,046

(22) Filed: Dec. 17, 2010

(65) Prior Publication Data
US 2012/0153493 A1 Jun. 21, 2012

(51) Int. Cl.
*H01L 29/40* (2006.01)
*H01L 23/52* (2006.01)
(Continued)

(52) U.S. Cl.
CPC ............ *H01L 25/16* (2013.01); *H01L 23/5389* (2013.01); *H01L 24/24* (2013.01); *H01L 24/82* (2013.01); *H01L 24/16* (2013.01); *H01L 24/32* (2013.01); *H01L 24/48* (2013.01); *H01L 24/73* (2013.01); *H01L 2224/04105* (2013.01); *H01L 2224/16225* (2013.01); *H01L 2224/24195* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01);
(Continued)

(58) Field of Classification Search
None
See application file for complete search history.

(56) References Cited

U.S. PATENT DOCUMENTS 3,390,226 A 6/1968 Fritz-Werner Beyerlein
3,903,590 A 9/1975 Yokogawa
(Continued)

FOREIGN PATENT DOCUMENTS

CN 1524293 10/2001
CN 1524293 A 10/2001
(Continued)

OTHER PUBLICATIONS

Imbera, "IMB Technology". available at http://www.imberacorp.com/imb-technology (brief printable download). Imbera Corporation, Melbourne, FL.
(Continued)

*Primary Examiner* — Mohammad Islam
*Assistant Examiner* — Jay C Chang
(74) *Attorney, Agent, or Firm* — Foley & Lardner LLP; Cliff Z. Liu; Angela D. Murch

(57) ABSTRACT

An embedded component device includes an electronic component including an electrical contact, an upper patterned conductive layer, a dielectric layer between the upper patterned conductive layer and the electronic component, a first electrical interconnect, a lower patterned conductive layer, a conductive via, and a second electrical interconnect. The dielectric layer has a first opening exposing the electrical contact, and a second opening extending from the lower patterned conductive layer to the upper patterned conductive layer. The first electrical interconnect extends from the electrical contact to the upper patterned conductive layer, and fills the first opening. The second opening has an upper portion exposing the upper patterned conductive layer and a lower portion exposing the lower patterned conductive layer. The conductive via is located at the lower portion of the second opening. The second electrical interconnect fills the upper portion of the second opening.

16 Claims, 31 Drawing Sheets

(51) Int. Cl.
*H01L 23/48* (2006.01)
*H01L 25/16* (2006.01)
*H01L 23/538* (2006.01)
*H01L 23/00* (2006.01)

(52) U.S. Cl.
CPC .......... *H01L 2924/00014* (2013.01); *H01L 2924/01029* (2013.01); *H01L 2924/181* (2013.01); *H01L 2924/3025* (2013.01)

(56) References Cited

U.S. PATENT DOCUMENTS

| | | |
|---|---|---|
| 3,959,874 A | 6/1976 | Coucoulas |
| 4,246,595 A | 1/1981 | Noyori et al. |
| 4,569,786 A | 2/1986 | Deguchi |
| 4,630,096 A | 12/1986 | Drye et al. |
| 4,717,948 A | 1/1988 | Sakai et al. |
| 4,783,695 A | 11/1988 | Eichelberger et al. |
| 4,814,205 A | 3/1989 | Arcilesi et al. |
| 4,821,007 A | 4/1989 | Fields et al. |
| 4,827,328 A | 5/1989 | Ozawa et al. |
| 4,860,166 A | 8/1989 | Nicholls |
| 4,866,501 A | 9/1989 | Shanefield |
| 4,897,708 A | 1/1990 | Clements |
| 4,907,062 A | 3/1990 | Fukushima |
| 4,939,568 A | 7/1990 | Kato et al. |
| 5,019,535 A | 5/1991 | Wojnarowski et al. |
| 5,049,980 A | 9/1991 | Saito et al. |
| 5,091,769 A | 2/1992 | Eichelberger |
| 5,111,278 A | 5/1992 | Eichelberger |
| 5,120,678 A | 6/1992 | Moore et al. |
| 5,140,745 A | 8/1992 | McKenzie, Jr. |
| 5,149,662 A | 9/1992 | Eichelberger |
| 5,151,770 A | 9/1992 | Inoue |
| 5,151,776 A | 9/1992 | Wojnarowski et al. |
| 5,157,589 A | 10/1992 | Cole, Jr. et al. |
| 5,166,772 A | 11/1992 | Soldner et al. |
| 5,172,077 A | 12/1992 | Funada |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,355,016 A | 10/1994 | Swirbel et al. |
| 5,422,513 A | 6/1995 | Marcinkiewicz et al. |
| 5,432,677 A | 7/1995 | Mowatt et al. |
| 5,497,033 A | 3/1996 | Fillion et al. |
| 5,519,936 A | 5/1996 | Andros et al. |
| 5,527,741 A | 6/1996 | Cole et al. |
| 5,546,654 A | 8/1996 | Wojnarowski et al. |
| 5,554,887 A | 9/1996 | Sawai et al. |
| 5,557,142 A | 9/1996 | Gilmore et al. |
| 5,565,706 A | 10/1996 | Miura et al. |
| 5,567,656 A | 10/1996 | Chun |
| 5,592,025 A | 1/1997 | Clark et al. |
| 5,600,181 A | 2/1997 | Scott et al. |
| 5,639,989 A | 6/1997 | Higgins, III |
| 5,677,511 A | 10/1997 | Taylor et al. |
| 5,694,300 A | 12/1997 | Mattei et al. |
| 5,703,400 A | 12/1997 | Wojnarowski et al. |
| 5,703,761 A | 12/1997 | Heiss |
| 5,710,062 A | 1/1998 | Sawai et al. |
| 5,726,612 A | 3/1998 | Mandai et al. |
| 5,729,437 A | 3/1998 | Hashimoto |
| 5,745,984 A | 5/1998 | Cole, Jr. et al. |
| 5,776,798 A | 7/1998 | Quan et al. |
| 5,834,340 A | 11/1998 | Sawai et al. |
| 5,841,190 A | 11/1998 | Noda et al. |
| 5,841,193 A | 11/1998 | Eichelberger |
| 5,847,930 A | 12/1998 | Kazle |
| 5,856,705 A | 1/1999 | Ting |
| 5,864,088 A | 1/1999 | Sato et al. |
| 5,866,952 A | 2/1999 | Wojnarowski et al. |
| 5,886,876 A | 3/1999 | Yamaguchi |
| 5,895,229 A | 4/1999 | Carney et al. |
| 5,898,344 A | 4/1999 | Hayashi |
| 5,945,741 A | 8/1999 | Ohsawa et al. |
| 5,966,052 A | 10/1999 | Sakai |
| 5,977,626 A | 11/1999 | Wang et al. |
| 5,990,546 A | 11/1999 | Igarashi et al. |
| 5,994,773 A | 11/1999 | Hirakawa |
| 5,998,867 A | 12/1999 | Jensen et al. |
| 6,013,953 A | 1/2000 | Nishihara et al. |
| 6,025,995 A | 2/2000 | Marcinkiewicz |
| 6,028,358 A | 2/2000 | Suzuki |
| 6,046,071 A | 4/2000 | Sawai et al. |
| 6,060,775 A | 5/2000 | Ano |
| 6,079,099 A | 6/2000 | Uchida et al. |
| 6,080,932 A | 6/2000 | Smith et al. |
| 6,087,717 A | 7/2000 | Ano et al. |
| 6,093,972 A | 7/2000 | Carney et al. |
| 6,110,608 A | 8/2000 | Tanimoto et al. |
| 6,117,704 A | 9/2000 | Yamaguchi et al. |
| 6,150,193 A | 11/2000 | Glenn |
| 6,154,366 A | 11/2000 | Ma et al. |
| 6,159,767 A | 12/2000 | Eichelberger |
| 6,225,694 B1 | 5/2001 | Terui |
| 6,232,151 B1 | 5/2001 | Ozmat et al. |
| 6,232,661 B1 | 5/2001 | Amagai et al. |
| 6,239,482 B1 | 5/2001 | Fillion et al. |
| 6,255,143 B1 | 7/2001 | Briar |
| 6,261,680 B1 | 7/2001 | Denman |
| 6,265,765 B1 | 7/2001 | DiStefano et al. |
| 6,265,783 B1 | 7/2001 | Juso et al. |
| 6,271,469 B1 | 8/2001 | Ma et al. |
| 6,278,181 B1 | 8/2001 | Maley |
| 6,294,406 B1 | 9/2001 | Bertin et al. |
| 6,294,741 B1 | 9/2001 | Cole, Jr. et al. |
| 6,306,680 B1 | 10/2001 | Fillion et al. |
| 6,323,045 B1 | 11/2001 | Cline et al. |
| 6,331,451 B1 | 12/2001 | Fusaro et al. |
| 6,358,780 B1 | 3/2002 | Smith et al. |
| 6,369,335 B1 | 4/2002 | Wajima |
| 6,376,769 B1 | 4/2002 | Chung |
| 6,377,461 B1 | 4/2002 | Ozmat et al. |
| 6,396,148 B1 | 5/2002 | Eichelberger et al. |
| 6,400,573 B1 | 6/2002 | Mowatt et al. |
| 6,423,566 B1 | 7/2002 | Feger et al. |
| 6,423,570 B1 | 7/2002 | Ma et al. |
| 6,426,545 B1 | 7/2002 | Eichelberger et al. |
| 6,448,174 B1 | 9/2002 | Ramm |
| 6,448,632 B1 | 9/2002 | Takiar et al. |
| 6,452,258 B1 | 9/2002 | Abys et al. |
| 6,455,864 B1 | 9/2002 | Featherby et al. |
| 6,472,598 B1 | 10/2002 | Glenn |
| 6,472,743 B2 | 10/2002 | Huang et al. |
| 6,479,903 B2 | 11/2002 | Briar |
| 6,485,595 B1 | 11/2002 | Yenni et al. |
| 6,486,005 B1 | 11/2002 | Kim |
| 6,486,006 B2 | 11/2002 | Hirano et al. |
| 6,486,545 B1 | 11/2002 | Glenn et al. |
| 6,492,194 B1 | 12/2002 | Bureau et al. |
| 6,495,914 B1 | 12/2002 | Sekine et al. |
| 6,521,978 B2 | 2/2003 | Fenk et al. |
| 6,552,430 B1 | 4/2003 | Perez et al. |
| 6,555,906 B2 | 4/2003 | Towle et al. |
| 6,555,908 B1 | 4/2003 | Eichelberger |
| 6,560,109 B2 | 5/2003 | Yamaguchi et al. |
| 6,566,596 B1 | 5/2003 | Askew |
| 6,580,159 B1 | 6/2003 | Fusaro et al. |
| 6,586,276 B2 | 7/2003 | Towle et al. |
| 6,586,822 B1 | 7/2003 | Vu et al. |
| 6,590,291 B2 | 7/2003 | Akagawa |
| 6,590,295 B1 | 7/2003 | Liao et al. |
| 6,602,737 B2 | 8/2003 | Wu |
| 6,614,102 B1 | 9/2003 | Hoffman et al. |
| 6,624,523 B2 | 9/2003 | Chao et al. |
| 6,635,953 B2 | 10/2003 | Wu |
| 6,639,324 B1 | 10/2003 | Chien |
| 6,646,354 B2 | 11/2003 | Cobbley et al. |
| 6,656,827 B1 | 12/2003 | Tsao et al. |
| 6,663,943 B2 | 12/2003 | Kadota |

(56) References Cited

U.S. PATENT DOCUMENTS

| | | |
|---|---|---|
| 6,680,529 B2 | 1/2004 | Chen et al. |
| 6,686,649 B1 | 2/2004 | Mathews et al. |
| 6,695,985 B2 | 2/2004 | Igarashi et al. |
| 6,701,614 B2 | 3/2004 | Ding et al. |
| 6,706,554 B2 | 3/2004 | Ogura |
| 6,707,137 B2 | 3/2004 | Kim |
| 6,709,896 B1 | 3/2004 | Cobbley et al. |
| 6,709,898 B1 | 3/2004 | Ma et al. |
| 6,713,859 B1 | 3/2004 | Ma |
| 6,717,061 B2 | 4/2004 | Yamaguchi et al. |
| 6,724,061 B2 | 4/2004 | Murata |
| 6,724,638 B1 | 4/2004 | Inagaki et al. |
| 6,734,370 B2 | 5/2004 | Yamaguchi et al. |
| 6,734,534 B1 | 5/2004 | Vu et al. |
| 6,734,542 B2 | 5/2004 | Nakatani et al. |
| 6,734,696 B2 | 5/2004 | Horner et al. |
| 6,740,546 B2 | 5/2004 | Corisis et al. |
| 6,740,959 B2 | 5/2004 | Alcoe et al. |
| 6,747,348 B2 | 6/2004 | Jeung et al. |
| 6,750,547 B2 | 6/2004 | Jeung et al. |
| 6,756,671 B2 | 6/2004 | Lee et al. |
| 6,757,181 B1 | 6/2004 | Villanueva et al. |
| 6,759,268 B2 | 7/2004 | Akagawa |
| 6,781,231 B2 | 8/2004 | Minervini |
| 6,787,894 B2 | 9/2004 | Jeung et al. |
| 6,790,706 B2 | 9/2004 | Jeung et al. |
| 6,800,804 B2 | 10/2004 | Igarashi et al. |
| 6,818,544 B2 | 11/2004 | Eichelberger et al. |
| 6,838,776 B2 | 1/2005 | Leal et al. |
| 6,845,554 B2 | 1/2005 | Frankowsky et al. |
| 6,849,945 B2 | 2/2005 | Horiuchi et al. |
| 6,856,007 B2 | 2/2005 | Warner |
| 6,865,084 B2 | 3/2005 | Lin et al. |
| 6,865,089 B2 | 3/2005 | Ho et al. |
| 6,867,480 B2 | 3/2005 | Thavarajah et al. |
| 6,872,893 B2 | 3/2005 | Fukuoka et al. |
| 6,876,544 B2 | 4/2005 | Hsin |
| 6,881,896 B2 | 4/2005 | Ebihara |
| 6,894,399 B2 | 5/2005 | Vu et al. |
| 6,900,383 B2 | 5/2005 | Babb et al. |
| 6,902,950 B2 | 6/2005 | Ma et al. |
| 6,905,914 B1 | 6/2005 | Huemoeller et al. |
| 6,919,508 B2 | 7/2005 | Forcier |
| 6,921,683 B2 | 7/2005 | Nakayama |
| 6,921,975 B2 | 7/2005 | Leal et al. |
| 6,928,719 B2 | 8/2005 | Kim et al. |
| 6,930,256 B1 | 8/2005 | Huemoeller et al. |
| 6,939,738 B2 | 9/2005 | Nakatani et al. |
| 6,948,944 B2 | 9/2005 | Ueno |
| 6,953,708 B2 | 10/2005 | Hedler et al. |
| 6,962,869 B1 | 11/2005 | Bao et al. |
| 6,964,887 B2 | 11/2005 | Akagawa |
| 6,964,889 B2 | 11/2005 | Ma et al. |
| 6,967,403 B2 | 11/2005 | Chuang et al. |
| 6,969,916 B2 | 11/2005 | Shizuno |
| 6,975,516 B2 | 12/2005 | Asahi et al. |
| 6,991,966 B2 | 1/2006 | Tuominen |
| 6,992,400 B2 | 1/2006 | Tikka et al. |
| 6,998,532 B2 | 2/2006 | Kawamoto et al. |
| 7,002,245 B2 | 2/2006 | Huang et al. |
| 7,012,323 B2 | 3/2006 | Warner et al. |
| 7,015,075 B2 | 3/2006 | Fay et al. |
| 7,019,406 B2 | 3/2006 | Huang et al. |
| 7,030,469 B2 | 4/2006 | Mahadevan et al. |
| 7,045,385 B2 | 5/2006 | Kim et al. |
| 7,045,908 B2 | 5/2006 | Ohsumi |
| 7,048,450 B2 | 5/2006 | Beer et al. |
| 7,049,682 B1 | 5/2006 | Mathews et al. |
| 7,053,475 B2 | 5/2006 | Akagawa |
| 7,067,356 B2 | 6/2006 | Towle et al. |
| 7,071,024 B2 | 7/2006 | Towle et al. |
| 7,078,788 B2 | 7/2006 | Vu et al. |
| 7,081,661 B2 | 7/2006 | Takehara et al. |
| 7,087,991 B2 | 8/2006 | Chen et al. |
| 7,091,595 B2 | 8/2006 | Fuergut et al. |
| 7,102,807 B2 | 9/2006 | Shi et al. |
| 7,112,467 B2 | 9/2006 | Eichelberger et al. |
| 7,122,901 B2 | 10/2006 | Sunohara et al. |
| 7,125,744 B2 | 10/2006 | Takehara et al. |
| 7,126,218 B1 | 10/2006 | Darveaux et al. |
| 7,132,312 B2 | 11/2006 | Huang et al. |
| 7,141,884 B2 | 11/2006 | Kojima et al. |
| 7,145,228 B2 | 12/2006 | Yean et al. |
| 7,161,252 B2 | 1/2007 | Tsuneoka et al. |
| 7,163,843 B2 | 1/2007 | Kiendl et al. |
| 7,170,152 B2 | 1/2007 | Huang et al. |
| 7,173,330 B2 | 2/2007 | Eng et al. |
| 7,176,567 B2 | 2/2007 | Yang et al. |
| 7,180,012 B2 | 2/2007 | Tsuneoka et al. |
| 7,183,498 B2 | 2/2007 | Ogura et al. |
| 7,185,426 B1 | 3/2007 | Hiner et al. |
| 7,186,928 B2 | 3/2007 | Kikuchi et al. |
| 7,187,060 B2 | 3/2007 | Usui |
| 7,187,070 B2 | 3/2007 | Chu et al. |
| 7,192,807 B1 | 3/2007 | Huemoeller et al. |
| 7,196,408 B2 | 3/2007 | Yang et al. |
| 7,205,674 B2 | 4/2007 | Huang et al. |
| 7,224,061 B2 | 5/2007 | Yang et al. |
| 7,238,602 B2 | 7/2007 | Yang |
| 7,247,523 B1 | 7/2007 | Huemoeller et al. |
| 7,262,081 B2 | 8/2007 | Yang et al. |
| 7,262,497 B2 | 8/2007 | Fang et al. |
| 7,276,783 B2 | 10/2007 | Goller et al. |
| 7,294,529 B2 | 11/2007 | Tuominen et al. |
| 7,294,587 B2 | 11/2007 | Asahi et al. |
| 7,294,791 B2 | 11/2007 | Danoski et al. |
| 7,294,920 B2 | 11/2007 | Chen et al. |
| 7,294,922 B2 | 11/2007 | Jobetto et al. |
| 7,299,546 B2 | 11/2007 | Tuominen et al. |
| 7,312,103 B1 | 12/2007 | Huemoeller et al. |
| 7,319,049 B2 | 1/2008 | Oi et al. |
| 7,327,015 B2 | 2/2008 | Yang et al. |
| 7,338,884 B2 | 3/2008 | Shimoto et al. |
| 7,338,892 B2 | 3/2008 | Wang et al. |
| 7,339,279 B2 | 3/2008 | Yang |
| 7,342,296 B2 | 3/2008 | Yang et al. |
| 7,342,303 B1 | 3/2008 | Berry et al. |
| 7,342,803 B2 | 3/2008 | Inagaki et al. |
| 7,344,917 B2 | 3/2008 | Gautham |
| 7,352,054 B2 | 4/2008 | Jobetto |
| 7,361,533 B1 | 4/2008 | Huemoeller et al. |
| 7,361,987 B2 | 4/2008 | Leal et al. |
| 7,364,944 B2 | 4/2008 | Huang et al. |
| 7,371,617 B2 | 5/2008 | Tsai et al. |
| 7,372,151 B1 | 5/2008 | Fan et al. |
| 7,411,306 B2 | 8/2008 | Leu et al. |
| 7,416,918 B2 | 8/2008 | Ma |
| 7,416,920 B2 | 8/2008 | Yang et al. |
| 7,420,272 B1 | 9/2008 | Huemoeller et al. |
| 7,420,273 B2 | 9/2008 | Liu et al. |
| 7,425,464 B2 | 9/2008 | Fay et al. |
| 7,445,957 B2 | 11/2008 | Huang et al. |
| 7,445,968 B2 | 11/2008 | Harrison et al. |
| 7,446,265 B2 | 11/2008 | Krohto et al. |
| 7,451,539 B2 | 11/2008 | Morris et al. |
| 7,453,148 B2 | 11/2008 | Yang et al. |
| 7,459,781 B2 | 12/2008 | Yang et al. |
| 7,476,563 B2 | 1/2009 | Mangrum et al. |
| 7,478,474 B2 | 1/2009 | Koga |
| 7,482,198 B2 | 1/2009 | Bauer et al. |
| 7,488,903 B2 | 2/2009 | Kawagishi et al. |
| 7,501,310 B2 | 3/2009 | Yang et al. |
| 7,501,696 B2 | 3/2009 | Koyama et al. |
| 7,511,356 B2 | 3/2009 | Subramanian |
| 7,511,365 B2 | 3/2009 | Wu et al. |
| 7,514,767 B2 | 4/2009 | Yang |
| 7,523,551 B2 | 4/2009 | Horng et al. |
| 7,525,185 B2 | 4/2009 | Yang et al. |
| 7,528,009 B2 | 5/2009 | Chen et al. |
| 7,547,967 B2 | 6/2009 | Jobetto et al. |
| 7,550,320 B2 | 6/2009 | Wang et al. |
| 7,550,843 B2 | 6/2009 | Mihara |
| 7,557,307 B2 | 7/2009 | Nishizawa et al. |
| 7,557,437 B2 | 7/2009 | Yang et al. |

(56) References Cited

U.S. PATENT DOCUMENTS

| | | |
|---|---|---|
| 7,564,121 B2 | 7/2009 | Sugimoto |
| 7,566,955 B2 | 7/2009 | Warner |
| 7,566,969 B2 | 7/2009 | Shimanuki |
| 7,572,676 B2 | 8/2009 | Leu et al. |
| 7,572,681 B1 | 8/2009 | Huemoeller et al. |
| 7,575,173 B2 | 8/2009 | Fuergut et al. |
| 7,576,415 B2 | 8/2009 | Cha et al. |
| 7,576,425 B2 | 8/2009 | Liu |
| 7,588,951 B2 | 9/2009 | Mangrum et al. |
| 7,591,067 B2 | 9/2009 | Wang |
| 7,595,226 B2 | 9/2009 | Lytle et al. |
| 7,595,553 B2 | 9/2009 | Nagamatsu et al. |
| 7,598,607 B2 | 10/2009 | Chung et al. |
| 7,609,527 B2 | 10/2009 | Tuominen et al. |
| 7,618,846 B1 | 11/2009 | Pagaila et al. |
| 7,619,304 B2 | 11/2009 | Bauer et al. |
| 7,619,901 B2 | 11/2009 | Eichelberger et al. |
| 7,622,733 B2 | 11/2009 | Fuergut et al. |
| 7,625,818 B2 | 12/2009 | Wang |
| 7,629,186 B2 | 12/2009 | Siaudeau |
| 7,629,199 B2 | 12/2009 | Huang et al. |
| 7,629,674 B1 | 12/2009 | Foster |
| 7,633,170 B2 | 12/2009 | Yang et al. |
| 7,633,765 B1 * | 12/2009 | Scanlan et al. ............. 361/760 |
| 7,639,473 B2 | 12/2009 | Hsu et al. |
| 7,642,128 B1 | 1/2010 | Lin et al. |
| 7,643,311 B2 | 1/2010 | Coffy |
| 7,655,501 B2 | 2/2010 | Yang et al. |
| 7,656,047 B2 | 2/2010 | Yang et al. |
| 7,662,667 B2 | 2/2010 | Shen |
| 7,667,318 B2 | 2/2010 | Yang et al. |
| 7,669,320 B2 | 3/2010 | Hurwitz et al. |
| 7,671,466 B2 | 3/2010 | Pu et al. |
| 7,675,157 B2 | 3/2010 | Liu et al. |
| 7,675,170 B2 | 3/2010 | Formosa |
| 7,687,823 B2 | 3/2010 | Amo et al. |
| 7,692,286 B1 | 4/2010 | Huemoeller et al. |
| 7,700,411 B2 | 4/2010 | Yang et al. |
| 7,714,431 B1 | 5/2010 | Huemoeller et al. |
| 7,724,431 B2 | 5/2010 | Field et al. |
| 7,727,803 B2 | 6/2010 | Yamagata |
| 7,727,818 B2 | 6/2010 | Hsieh et al. |
| 7,732,242 B2 | 6/2010 | Brunnbauer et al. |
| 7,741,151 B2 | 6/2010 | Amrine et al. |
| 7,741,156 B2 | 6/2010 | Pagaila et al. |
| 7,745,910 B1 | 6/2010 | Olson et al. |
| 7,750,467 B2 | 7/2010 | Pu et al. |
| 7,759,163 B2 | 7/2010 | Kroeninger et al. |
| 7,763,976 B2 | 7/2010 | Tang et al. |
| 7,767,495 B2 | 8/2010 | Fuergut et al. |
| 7,772,046 B2 | 8/2010 | Pagaila et al. |
| 7,799,602 B2 | 9/2010 | Pagaila et al. |
| 7,807,512 B2 | 10/2010 | Lee et al. |
| 7,812,434 B2 | 10/2010 | Yang |
| 7,829,981 B2 | 11/2010 | Hsu |
| 7,829,987 B2 | 11/2010 | Chia |
| 7,830,004 B2 | 11/2010 | Wu et al. |
| 7,834,464 B2 | 11/2010 | Meyer et al. |
| 7,842,541 B1 | 11/2010 | Rusli et al. |
| 7,880,091 B2 | 2/2011 | Miyamoto et al. |
| 7,932,599 B2 | 4/2011 | Kiendl et al. |
| 7,936,050 B2 | 5/2011 | Shin |
| 7,939,935 B2 | 5/2011 | Chinda et al. |
| 7,948,090 B2 | 5/2011 | Manepalli et al. |
| 7,964,957 B2 | 6/2011 | Noguchi et al. |
| 7,989,928 B2 | 8/2011 | Liao et al. |
| 8,015,700 B2 | 9/2011 | Nakamura et al. |
| 8,017,515 B2 | 9/2011 | Marimuthu et al. |
| 8,018,040 B2 | 9/2011 | Jang et al. |
| 8,022,511 B2 | 9/2011 | Chiu et al. |
| 8,030,750 B2 | 10/2011 | Kim et al. |
| 8,035,213 B2 | 10/2011 | Lee et al. |
| 8,039,303 B2 | 10/2011 | Shim et al. |
| 8,039,304 B2 | 10/2011 | Pagaila |
| 8,076,757 B2 | 12/2011 | Pagaila et al. |
| 8,093,690 B2 | 1/2012 | Ko et al. |
| 8,101,864 B2 | 1/2012 | Chinda et al. |
| 8,105,872 B2 | 1/2012 | Pagaila et al. |
| 8,110,902 B2 | 2/2012 | Eun et al. |
| 8,110,916 B2 | 2/2012 | Weng et al. |
| 8,193,647 B2 | 6/2012 | Hsieh et al. |
| 8,212,339 B2 | 7/2012 | Liao et al. |
| 8,212,340 B2 | 7/2012 | Liao |
| 8,220,145 B2 | 7/2012 | Hiner et al. |
| 8,222,976 B2 | 7/2012 | Yasooka |
| 8,227,706 B2 | 7/2012 | Roy et al. |
| 8,230,591 B2 | 7/2012 | Chinda et al. |
| 8,278,746 B2 | 10/2012 | Ding et al. |
| 8,320,134 B2 | 11/2012 | Su et al. |
| 8,358,001 B2 | 1/2013 | Yang et al. |
| 8,362,597 B1 | 1/2013 | Foster |
| 8,368,185 B2 | 2/2013 | Lee et al. |
| 8,372,689 B2 | 2/2013 | Lee et al. |
| 8,378,466 B2 | 2/2013 | Chiu et al. |
| 8,405,213 B2 | 3/2013 | Chen et al. |
| 8,410,584 B2 | 4/2013 | An et al. |
| 8,432,022 B1 | 4/2013 | Huemoeller et al. |
| 8,450,836 B2 | 5/2013 | Uemura et al. |
| 8,471,215 B1 | 6/2013 | Kurin et al. |
| 8,569,894 B2 | 10/2013 | Su et al. |
| 8,624,374 B2 | 1/2014 | Ding et al. |
| 8,884,424 B2 | 11/2014 | Su et al. |
| 8,941,222 B2 | 1/2015 | Hunt |
| 2001/0008301 A1 | 7/2001 | Terui |
| 2002/0053724 A1 | 5/2002 | Lai et al. |
| 2002/0056192 A1 | 5/2002 | Suwa et al. |
| 2002/0093108 A1 | 7/2002 | Grigorov |
| 2002/0127780 A1 | 9/2002 | Ma et al. |
| 2002/0158334 A1 | 10/2002 | Vu et al. |
| 2003/0077871 A1 | 4/2003 | Cheng et al. |
| 2003/0090883 A1 | 5/2003 | Asahi et al. |
| 2004/0012099 A1 | 1/2004 | Nakayama |
| 2004/0020673 A1 | 2/2004 | Mazurkiewicz |
| 2004/0063242 A1 | 4/2004 | Karnezos |
| 2004/0150097 A1 | 8/2004 | Gaynes et al. |
| 2004/0155352 A1 | 8/2004 | Ma |
| 2004/0155354 A1 | 8/2004 | Hanaoka et al. |
| 2004/0178500 A1 | 9/2004 | Usui |
| 2004/0231872 A1 | 11/2004 | Arnold et al. |
| 2004/0252475 A1 | 12/2004 | Tsuneoka et al. |
| 2005/0013082 A1 | 1/2005 | Kawamoto et al. |
| 2005/0029673 A1 | 2/2005 | Naka et al. |
| 2005/0039946 A1 | 2/2005 | Nakao |
| 2005/0045358 A1 | 3/2005 | Arnold |
| 2005/0046001 A1 | 3/2005 | Warner |
| 2005/0062173 A1 | 3/2005 | Vu et al. |
| 2005/0110163 A1 | 5/2005 | Koo et al. |
| 2005/0112798 A1 | 5/2005 | Bjorbell |
| 2005/0208702 A1 | 9/2005 | Kim |
| 2005/0212110 A1 | 9/2005 | Kato |
| 2005/0253223 A1 | 11/2005 | Marques |
| 2005/0253244 A1 | 11/2005 | Chang |
| 2005/0285147 A1 * | 12/2005 | Usui et al. ............. 257/202 |
| 2006/0065387 A1 | 3/2006 | Tonapi et al. |
| 2006/0071315 A1 | 4/2006 | Oh et al. |
| 2006/0145361 A1 | 7/2006 | Yang et al. |
| 2006/0148317 A1 | 7/2006 | Akaike et al. |
| 2006/0160261 A1 | 7/2006 | Sheats et al. |
| 2006/0231944 A1 | 10/2006 | Huang et al. |
| 2006/0266547 A1 | 11/2006 | Koga |
| 2006/0284300 A1 | 12/2006 | Nishizawa et al. |
| 2006/0292753 A1 | 12/2006 | Takahashi et al. |
| 2007/0025092 A1 | 2/2007 | Lee et al. |
| 2007/0030661 A1 | 2/2007 | Morris et al. |
| 2007/0059866 A1 | 3/2007 | Yang et al. |
| 2007/0069389 A1 | 3/2007 | Wollanke et al. |
| 2007/0096311 A1 | 5/2007 | Humpston et al. |
| 2007/0108580 A1 | 5/2007 | Goller |
| 2007/0131349 A1 | 6/2007 | Tuominen et al. |
| 2007/0145539 A1 | 6/2007 | Lam |
| 2007/0145541 A1 | 6/2007 | Lee et al. |
| 2007/0170582 A1 | 7/2007 | Nomura et al. |
| 2007/0170595 A1 | 7/2007 | Sinha |
| 2007/0176281 A1 | 8/2007 | Kim et al. |

(56) References Cited

U.S. PATENT DOCUMENTS

| | | |
|---|---|---|
| 2007/0190690 A1 | 8/2007 | Chow et al. |
| 2007/0221399 A1 | 9/2007 | Nishizawa et al. |
| 2007/0222054 A1 | 9/2007 | Hembree |
| 2007/0227761 A1 | 10/2007 | Tuominen et al. |
| 2007/0234563 A1 | 10/2007 | Sakaguchi et al. |
| 2007/0241437 A1 | 10/2007 | Kagaya et al. |
| 2007/0246252 A1 | 10/2007 | Buchwalter et al. |
| 2007/0246806 A1 | 10/2007 | Ong et al. |
| 2007/0252481 A1 | 11/2007 | Iwamoto et al. |
| 2007/0262422 A1 | 11/2007 | Bakalski et al. |
| 2007/0273008 A1 | 11/2007 | Suzuki |
| 2007/0281471 A1* | 12/2007 | Hurwitz et al. ............... 438/638 |
| 2007/0296065 A1 | 12/2007 | Yew et al. |
| 2008/0042301 A1 | 2/2008 | Yang et al. |
| 2008/0061407 A1 | 3/2008 | Yang et al. |
| 2008/0085572 A1 | 4/2008 | Yang et al. |
| 2008/0087988 A1 | 4/2008 | Lee et al. |
| 2008/0089048 A1 | 4/2008 | Yamano et al. |
| 2008/0094805 A1 | 4/2008 | Tuominen et al. |
| 2008/0105967 A1 | 5/2008 | Yang et al. |
| 2008/0116564 A1* | 5/2008 | Yang et al. .................... 257/698 |
| 2008/0128890 A1 | 6/2008 | Choi et al. |
| 2008/0136002 A1 | 6/2008 | Yang |
| 2008/0136004 A1 | 6/2008 | Yang et al. |
| 2008/0136033 A1 | 6/2008 | Nagamatsu et al. |
| 2008/0136041 A1 | 6/2008 | Katake et al. |
| 2008/0137314 A1 | 6/2008 | Salama et al. |
| 2008/0142960 A1 | 6/2008 | Leal et al. |
| 2008/0153209 A1 | 6/2008 | Liu et al. |
| 2008/0153245 A1 | 6/2008 | Lin et al. |
| 2008/0157316 A1 | 7/2008 | Yang |
| 2008/0157327 A1 | 7/2008 | Yang |
| 2008/0157336 A1 | 7/2008 | Yang |
| 2008/0157396 A1 | 7/2008 | Yang |
| 2008/0157402 A1 | 7/2008 | Ramakrishna et al. |
| 2008/0174008 A1 | 7/2008 | Yang et al. |
| 2008/0174013 A1 | 7/2008 | Yang et al. |
| 2008/0191343 A1 | 8/2008 | Liu |
| 2008/0197469 A1 | 8/2008 | Yang et al. |
| 2008/0197473 A1 | 8/2008 | Chen et al. |
| 2008/0197479 A1 | 8/2008 | Kim et al. |
| 2008/0210462 A1 | 9/2008 | Kawagishi et al. |
| 2008/0230860 A1 | 9/2008 | Yen et al. |
| 2008/0230887 A1 | 9/2008 | Sun et al. |
| 2008/0237879 A1 | 10/2008 | Yang |
| 2008/0246126 A1 | 10/2008 | Bowles et al. |
| 2008/0251908 A1 | 10/2008 | Yang et al. |
| 2008/0258293 A1 | 10/2008 | Yang et al. |
| 2008/0265421 A1 | 10/2008 | Brunnbauer et al. |
| 2008/0272499 A1 | 11/2008 | DeNatale et al. |
| 2008/0274593 A1 | 11/2008 | Yang et al. |
| 2008/0284035 A1 | 11/2008 | Brunnbauer et al. |
| 2008/0296697 A1 | 12/2008 | Hsu et al. |
| 2008/0303110 A1 | 12/2008 | Lee |
| 2008/0315375 A1 | 12/2008 | Eichelberger et al. |
| 2008/0315377 A1 | 12/2008 | Eichelberger et al. |
| 2008/0315391 A1 | 12/2008 | Kohl et al. |
| 2008/0315404 A1 | 12/2008 | Eichelberger et al. |
| 2009/0000114 A1 | 1/2009 | Rao et al. |
| 2009/0000815 A1 | 1/2009 | Hiner et al. |
| 2009/0000816 A1 | 1/2009 | Hiner et al. |
| 2009/0002969 A1 | 1/2009 | Madsen et al. |
| 2009/0002970 A1 | 1/2009 | Leahy et al. |
| 2009/0002971 A1 | 1/2009 | Carey et al. |
| 2009/0002972 A1 | 1/2009 | Carey et al. |
| 2009/0014826 A1 | 1/2009 | Chien et al. |
| 2009/0014872 A1 | 1/2009 | Tuominen et al. |
| 2009/0025211 A1 | 1/2009 | Hiner et al. |
| 2009/0027863 A1 | 1/2009 | Karnezos |
| 2009/0035895 A1 | 2/2009 | Lee et al. |
| 2009/0039455 A1 | 2/2009 | Chien |
| 2009/0050995 A1 | 2/2009 | Liu et al. |
| 2009/0050996 A1 | 2/2009 | Liu et al. |
| 2009/0051025 A1 | 2/2009 | Yang et al. |
| 2009/0075428 A1* | 3/2009 | Tang et al. .................... 438/114 |
| 2009/0096093 A1 | 4/2009 | Yang et al. |
| 2009/0096098 A1 | 4/2009 | Yang et al. |
| 2009/0101400 A1* | 4/2009 | Yamakoshi ................... 174/260 |
| 2009/0102003 A1 | 4/2009 | Vogt et al. |
| 2009/0102066 A1 | 4/2009 | Lee et al. |
| 2009/0108460 A1 | 4/2009 | Otremba et al. |
| 2009/0127680 A1 | 5/2009 | Do et al. |
| 2009/0127686 A1 | 5/2009 | Yang et al. |
| 2009/0129037 A1 | 5/2009 | Yoshino |
| 2009/0133251 A1 | 5/2009 | Tuominen et al. |
| 2009/0140394 A1 | 6/2009 | Bathan et al. |
| 2009/0140436 A1 | 6/2009 | Wang |
| 2009/0140441 A1 | 6/2009 | Camacho et al. |
| 2009/0140442 A1 | 6/2009 | Lin |
| 2009/0146297 A1 | 6/2009 | Badakere et al. |
| 2009/0152688 A1 | 6/2009 | Do et al. |
| 2009/0155959 A1 | 6/2009 | Lin et al. |
| 2009/0160046 A1 | 6/2009 | Otremba et al. |
| 2009/0160053 A1 | 6/2009 | Meyer et al. |
| 2009/0166785 A1 | 7/2009 | Camacho et al. |
| 2009/0166873 A1 | 7/2009 | Yang et al. |
| 2009/0170241 A1 | 7/2009 | Shim |
| 2009/0170242 A1 | 7/2009 | Lin et al. |
| 2009/0176348 A1 | 7/2009 | Griffiths |
| 2009/0194851 A1 | 8/2009 | Chiu et al. |
| 2009/0194852 A1 | 8/2009 | Chiu et al. |
| 2009/0200648 A1 | 8/2009 | Graves |
| 2009/0221114 A1 | 9/2009 | Xu |
| 2009/0224391 A1 | 9/2009 | Lin et al. |
| 2009/0230487 A1 | 9/2009 | Saitoh et al. |
| 2009/0230523 A1 | 9/2009 | Chien et al. |
| 2009/0230524 A1 | 9/2009 | Chien et al. |
| 2009/0230525 A1 | 9/2009 | Chang Chien et al. |
| 2009/0230526 A1 | 9/2009 | Chen et al. |
| 2009/0230542 A1 | 9/2009 | Lin et al. |
| 2009/0236686 A1 | 9/2009 | Shim et al. |
| 2009/0236700 A1 | 9/2009 | Moriya |
| 2009/0236749 A1 | 9/2009 | Otremba et al. |
| 2009/0256244 A1 | 10/2009 | Liao et al. |
| 2009/0256247 A1 | 10/2009 | Landau et al. |
| 2009/0261466 A1 | 10/2009 | Pagaila et al. |
| 2009/0261470 A1 | 10/2009 | Choi et al. |
| 2009/0273075 A1 | 11/2009 | Meyer-Berg |
| 2009/0278238 A1 | 11/2009 | Bonifield et al. |
| 2009/0294899 A1 | 12/2009 | Pagaila et al. |
| 2009/0294911 A1 | 12/2009 | Pagaila et al. |
| 2009/0294928 A1 | 12/2009 | Kim et al. |
| 2009/0302435 A1 | 12/2009 | Pagaila et al. |
| 2009/0302439 A1 | 12/2009 | Pagaila et al. |
| 2009/0302446 A1 | 12/2009 | Lee et al. |
| 2009/0309212 A1 | 12/2009 | Shim et al. |
| 2009/0315156 A1 | 12/2009 | Harper |
| 2010/0001396 A1 | 1/2010 | Meyer et al. |
| 2010/0006330 A1* | 1/2010 | Fu ........................ H01L 21/486<br>174/260 |
| 2010/0006987 A1 | 1/2010 | Murugan et al. |
| 2010/0006994 A1 | 1/2010 | Shim et al. |
| 2010/0007029 A1 | 1/2010 | Do et al. |
| 2010/0013064 A1 | 1/2010 | Hsu |
| 2010/0013065 A1 | 1/2010 | Mistry et al. |
| 2010/0013081 A1 | 1/2010 | Toh et al. |
| 2010/0013102 A1 | 1/2010 | Tay et al. |
| 2010/0019359 A1 | 1/2010 | Pagaila et al. |
| 2010/0019370 A1 | 1/2010 | Pressel et al. |
| 2010/0019381 A1 | 1/2010 | Haeberlen et al. |
| 2010/0031500 A1 | 2/2010 | Eichelberger et al. |
| 2010/0032091 A1 | 2/2010 | Eichelberger et al. |
| 2010/0032764 A1 | 2/2010 | Andry et al. |
| 2010/0032815 A1 | 2/2010 | An et al. |
| 2010/0032818 A1 | 2/2010 | Pilling et al. |
| 2010/0035384 A1 | 2/2010 | Eichelberger et al. |
| 2010/0044855 A1 | 2/2010 | Eichelberger et al. |
| 2010/0047970 A1 | 2/2010 | Eichelberger et al. |
| 2010/0052135 A1 | 3/2010 | Shim et al. |
| 2010/0059853 A1 | 3/2010 | Lin et al. |
| 2010/0059854 A1 | 3/2010 | Lin et al. |
| 2010/0059898 A1 | 3/2010 | Keeth et al. |
| 2010/0072599 A1 | 3/2010 | Camacho et al. |
| 2010/0072618 A1 | 3/2010 | Camacho et al. |

(56) References Cited

U.S. PATENT DOCUMENTS

| | | |
|---|---|---|
| 2010/0078776 A1 | 4/2010 | Barth et al. |
| 2010/0078777 A1 | 4/2010 | Barth et al. |
| 2010/0078779 A1 | 4/2010 | Barth et al. |
| 2010/0084759 A1 | 4/2010 | Shen |
| 2010/0096739 A1 | 4/2010 | Kawabata et al. |
| 2010/0109132 A1 | 5/2010 | Ko et al. |
| 2010/0110656 A1 | 5/2010 | Ko et al. |
| 2010/0133704 A1 | 6/2010 | Marimuthu et al. |
| 2010/0140736 A1 | 6/2010 | Lin et al. |
| 2010/0140759 A1 | 6/2010 | Pagaila et al. |
| 2010/0140771 A1 | 6/2010 | Huang et al. |
| 2010/0140779 A1 | 6/2010 | Lin et al. |
| 2010/0148357 A1 | 6/2010 | Yang et al. |
| 2010/0163295 A1 | 7/2010 | Roy et al. |
| 2010/0200951 A1 | 8/2010 | Lin et al. |
| 2010/0207257 A1 | 8/2010 | Lee |
| 2010/0207258 A1 | 8/2010 | Eun et al. |
| 2010/0207259 A1 | 8/2010 | Liao et al. |
| 2010/0214780 A1 | 8/2010 | Villard |
| 2010/0219514 A1 | 9/2010 | Ohguro |
| 2010/0221873 A1 | 9/2010 | Marimuthu et al. |
| 2010/0224983 A1 | 9/2010 | Huang et al. |
| 2010/0230795 A1 | 9/2010 | Kriman et al. |
| 2010/0233831 A1 | 9/2010 | Pohl et al. |
| 2010/0237477 A1 | 9/2010 | Pagaila et al. |
| 2010/0244208 A1 | 9/2010 | Pagaila et al. |
| 2010/0270661 A1 | 10/2010 | Pagaila et al. |
| 2010/0276792 A1 | 11/2010 | Chi et al. |
| 2010/0289126 A1* | 11/2010 | Pagaila ............ H01L 23/49822 257/659 |
| 2010/0308449 A1 | 12/2010 | Yang et al. |
| 2010/0314726 A1 | 12/2010 | Mueller et al. |
| 2010/0314746 A1 | 12/2010 | Hsieh et al. |
| 2010/0320585 A1 | 12/2010 | Jiang et al. |
| 2010/0320593 A1 | 12/2010 | Weng et al. |
| 2010/0326707 A1 | 12/2010 | Kwon et al. |
| 2011/0006408 A1 | 1/2011 | Liao |
| 2011/0010509 A1 | 1/2011 | Flores et al. |
| 2011/0018118 A1 | 1/2011 | Hsieh et al. |
| 2011/0018124 A1 | 1/2011 | Yang et al. |
| 2011/0037169 A1 | 2/2011 | Pagaila et al. |
| 2011/0068433 A1 | 3/2011 | Kim et al. |
| 2011/0068453 A1 | 3/2011 | Cho et al. |
| 2011/0068459 A1 | 3/2011 | Pagaila et al. |
| 2011/0074008 A1 | 3/2011 | Hsieh |
| 2011/0101509 A1 | 5/2011 | Han et al. |
| 2011/0115059 A1 | 5/2011 | Lee et al. |
| 2011/0115060 A1 | 5/2011 | Chiu et al. |
| 2011/0115066 A1 | 5/2011 | Kim et al. |
| 2011/0115082 A1 | 5/2011 | Gluschenkov et al. |
| 2011/0127654 A1 | 6/2011 | Weng et al. |
| 2011/0140364 A1 | 6/2011 | Head |
| 2011/0169150 A1 | 7/2011 | Su et al. |
| 2011/0177654 A1 | 7/2011 | Lee et al. |
| 2011/0194265 A1 | 8/2011 | Su et al. |
| 2011/0227219 A1 | 9/2011 | Alvarado et al. |
| 2011/0227220 A1 | 9/2011 | Chen et al. |
| 2011/0241192 A1 | 10/2011 | Ding et al. |
| 2011/0241193 A1 | 10/2011 | Ding et al. |
| 2011/0241194 A1 | 10/2011 | Chen et al. |
| 2011/0260302 A1 | 10/2011 | Bakalski et al. |
| 2011/0278703 A1 | 11/2011 | Pagaila et al. |
| 2011/0278741 A1 | 11/2011 | Chua et al. |
| 2011/0298109 A1 | 12/2011 | Pagaila et al. |
| 2011/0309488 A1 | 12/2011 | Pagaila |
| 2012/0038053 A1 | 2/2012 | Oh et al. |
| 2012/0056321 A1 | 3/2012 | Pagaila |
| 2012/0074538 A1 | 3/2012 | Tsai et al. |
| 2012/0077311 A1 | 3/2012 | Kim et al. |
| 2012/0098109 A1 | 4/2012 | Ko et al. |
| 2012/0104570 A1 | 5/2012 | Kim |
| 2012/0104571 A1 | 5/2012 | Yoo |
| 2012/0104572 A1 | 5/2012 | Yoo |
| 2012/0104573 A1 | 5/2012 | Pagaila et al. |
| 2012/0112326 A1 | 5/2012 | Pagaila et al. |
| 2012/0119373 A1 | 5/2012 | Hunt |
| 2012/0153472 A1 | 6/2012 | Pagaila et al. |
| 2012/0175732 A1 | 7/2012 | Lin et al. |
| 2012/0199958 A1 | 8/2012 | Horibe |
| 2012/0199972 A1 | 8/2012 | Pagaila et al. |
| 2012/0235309 A1 | 9/2012 | Essig et al. |
| 2012/0247275 A1 | 10/2012 | Yang et al. |
| 2012/0292749 A1 | 11/2012 | Pagaila et al. |
| 2012/0306063 A1 | 12/2012 | Kimura et al. |
| 2013/0228904 A1 | 9/2013 | Brunnbauer et al. |

FOREIGN PATENT DOCUMENTS

| | | |
|---|---|---|
| CN | 1442033 A | 9/2003 |
| CN | 1774804 A | 5/2006 |
| CN | 1873935 A | 12/2006 |
| CN | 100536127 C | 9/2009 |
| CN | 102157476 A | 8/2011 |
| FR | 2572849 | 5/1986 |
| GB | 2 130 794 | 6/1984 |
| JP | 55-044737 | 3/1980 |
| JP | 58-122759 | 7/1983 |
| JP | 59-051555 | 3/1984 |
| JP | 63-262860 | 10/1988 |
| JP | 39-037043 | 2/1989 |
| JP | 39-064298 | 3/1989 |
| JP | 02-078299 | 3/1990 |
| JP | 03-023654 | 1/1991 |
| JP | 03-171652 | 7/1991 |
| JP | 04-147652 | 5/1992 |
| JP | 04-206858 | 7/1992 |
| JP | 05-129476 | 5/1993 |
| JP | 07-335783 | 12/1995 |
| JP | 08-288686 | 11/1996 |
| JP | 10-125819 | 5/1998 |
| JP | 2003-273571 | 9/2003 |
| JP | 2004007006 | 1/2004 |
| JP | 2004-327855 | 11/2004 |
| JP | 2009-054686 | 3/2009 |
| TW | 1236323 | 7/2005 |
| TW | I236323 | 7/2005 |
| TW | 200739875 | 10/2007 |
| TW | 200828540 | 7/2008 |
| TW | 200849503 | 12/2008 |
| TW | 200941637 A | 10/2009 |
| TW | 200947607 | 11/2009 |
| WO | WO-02/33751 | 4/2002 |
| WO | WO 0233751 | 4/2002 |
| WO | WO-2004/060034 A1 | 7/2004 |
| WO | WO-2006/076613 A2 | 7/2006 |
| WO | WO-2009/115449 | 9/2009 |
| WO | WO2010035866 | 4/2010 |

OTHER PUBLICATIONS

Samsung "Overview Buildup CSP." (downloaded Dec. 17, 2010) (See https://sem.samsung.co.kr/en/product/prd_content.jsp?prd_id=A050&menu_id= A050002&NavNum2=2&CateNum1=1&CateNum2=3&CateNum3=1&CateNum4=4).

Ding et al., U.S. Appl. No. 12/753,840, filed Apr. 2, 2010 for "Semiconductor Device Packages with Fan-Out and with Connecting Elements for Stacking and Manufacturing Methods Thereof".

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,14, filed Sep. 1, 2010 for "Stackable Semiconductor Package and Manufacturing Method Thereof."

CitiBus Hybrid Electric StarTrans, CitiBus HD Senator, http://www.azuredynamics.com/products/citibus-hybrid-electric.htm; retrieved on Sep. 17, 2008, 2 pages.

Office action and Search Report for Taiwan Patent Application No. 099146979 dated Feb. 5, 2015.

(56) References Cited

OTHER PUBLICATIONS

Search Report for Taiwan Application No. TW 100106679 dated Mar. 7, 2014 (English machine translation) 1 page.

TW200739875 English Abstract Only.
Weng et al. U.S. Appl. No. 12/648,270, filed Dec. 28, 2009 entitled "Chip Package Structure and Manufacturing Methods Thereof."

* cited by examiner

EMBEDDED COMPONENT DEVICE AND MANUFACTURING METHODS THEREOF

BACKGROUND OF THE INVENTION

1. Field of the Invention

The invention relates generally to substrates including electrical circuitry and manufacturing methods thereof. More particularly, the invention relates to an embedded component device and manufacturing methods thereof.

2. Description of Related Art

Semiconductor devices have become progressively more complex, driven at least in part by the demand for smaller sizes and enhanced processing speeds. At the same time, there is a demand to further miniaturize many electronic products including these semiconductor devices. Semiconductor devices are typically packaged, and then may be installed on a substrate including electrical circuitry, such as a circuit board. This results in space being occupied by both the semiconductor device package and the substrate, and in surface area on the substrate being occupied by the semiconductor device package. In addition, additional cost may be incurred by performing packaging, circuit board manufacturing, and assembly as separate processes. It would be desirable to reduce the space occupied by the semiconductor device on the substrate, and to simplify and combine the packaging, circuit board manufacturing, and assembly processes as applied to the semiconductor device and the substrate.

It is against this background that a need arose to develop the embedded component device and related methods described herein.

SUMMARY OF THE INVENTION

One aspect of the invention relates to an embedded component device. In one embodiment, the embedded component device includes an electronic component including an electrical contact, an upper patterned conductive layer, a dielectric layer between the upper patterned conductive layer and the electronic component, a first electrical interconnect, a lower patterned conductive layer, a conductive via, and a second electrical interconnect. The dielectric layer has a first opening exposing the electrical contact, and a second opening extending from the lower patterned conductive layer to the upper patterned conductive layer. The first electrical interconnect extends from the electrical contact to the upper patterned conductive layer, and fills the first opening. The second opening has an upper portion exposing the upper patterned conductive layer and a lower portion exposing the lower patterned conductive layer. The conductive via is located at the lower portion of the second opening. The second electrical interconnect fills the upper portion of the second opening.

Another aspect of the invention relates to a method of manufacturing an embedded component device. In one embodiment, the method includes: (1) providing a first patterned conductive layer and an electronic component; (2) forming a conductive via extending vertically from the first patterned conductive layer, the conductive via having an upper surface; (3) disposing a dielectric layer and a conductive sheet covering the electronic component and the conductive via, where the conductive sheet is adjacent to an upper surface of the dielectric layer, the dielectric layer separating the conductive sheet from the electronic component and from the conductive via; (4) forming a first opening extending through the conductive sheet and the dielectric layer to expose the upper surface of the conductive via; (5) forming a first electrical interconnect connecting the conductive via to the conductive sheet, where the first electrical interconnect fills the first opening; and (6) forming a second patterned conductive layer from the conductive sheet.

Another aspect of the invention relates to a method of manufacturing an embedded component device. In one embodiment, the method includes: (1) providing an electronic component and a first conductive sheet having a lower surface; (2) forming a conductive block adjacent to the lower surface of the first conductive sheet; (3) disposing a dielectric layer adjacent to the lower surface of the first conductive sheet and covering a lateral surface of the conductive block; (4) disposing a lower dielectric layer adjacent to the dielectric layer and the conductive block, the lower dielectric layer covering a lower surface of the conductive block; (5) forming a first patterned conductive layer from the first conductive sheet, the first patterned conductive layer having a lower surface adjacent to the lower dielectric layer and an upper surface; (6) forming a conductive via extending vertically from the upper surface of the first patterned conductive layer; (7) after forming the conductive via, removing the conductive block to form a first opening extending through the dielectric layer and exposing a portion of the lower dielectric layer; and (8) disposing the electronic component at least partially in the first opening and adjacent to the portion of the lower dielectric layer.

Other aspects and embodiments of the invention are also contemplated. The foregoing summary and the following detailed description are not meant to restrict the invention to any particular embodiment but are merely meant to describe some embodiments of the invention.

Figure 1:
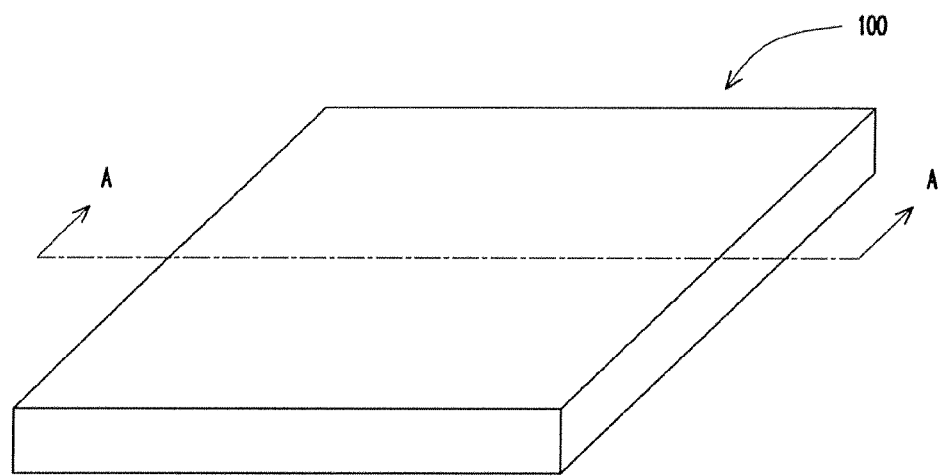
FIG. 1 illustrates a perspective view of an embedded component device, according to an embodiment of the invention.

The drawings illustrate embodiments of the invention and, together with the description, serve to explain the principles of some embodiments of the invention. Reference will now be made in detail to some embodiments of the invention, examples of which are illustrated in the accompanying drawings. Wherever possible, the same reference numbers are used in the drawings and the descriptions to refer to the same or like features.

DETAILED DESCRIPTION OF THE INVENTION

Attention first turns to FIG. 1, which illustrates a perspective view of an embedded component device 100 implemented in accordance with an embodiment of the invention. The embedded component device 100 may include an embedded package, substrate, and/or module, and may include active components, passive components, or both active and passive components. In the illustrated embodiment, sides of the embedded component device 100 are substantially planar and have a substantially orthogonal orientation so as to define a lateral profile that extends around substantially an entire periphery of the embedded component device 100. This orthogonal lateral profile allows a reduced overall size by reducing or minimizing an area of the embedded component device 100. This reduction in area may be advantageous, for example, because the area may correspond to a footprint area of the embedded component device 100 when stacked on another substrate. However, it is contemplated that the lateral profile of the embedded component device 100, in general, can be any of a number of shapes, such as curved, inclined, stepped, or roughly textured. Some embodiments of the internal structure of the embedded component device 100 are illustrated in FIG. 2 through FIG. 5.

Figure 2:
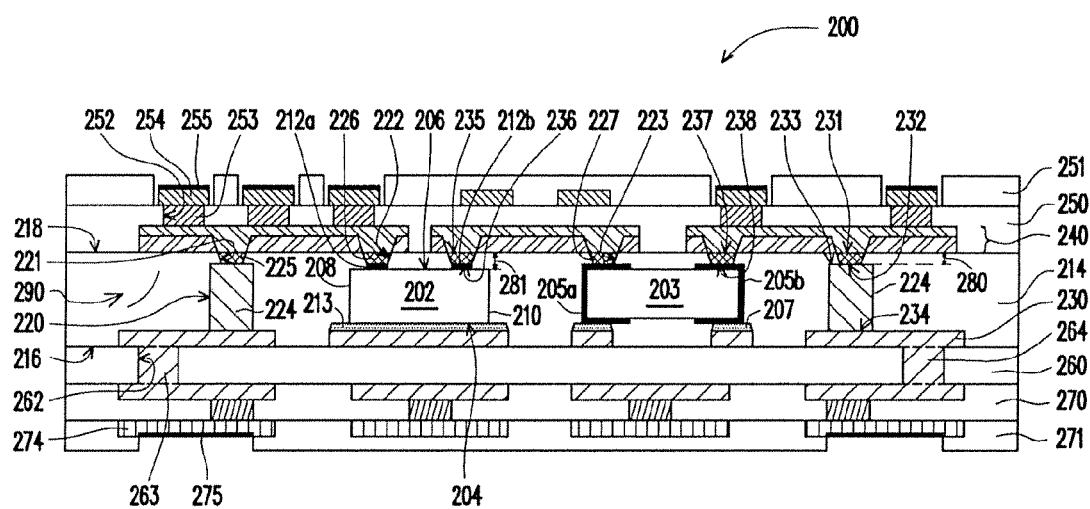
FIG. 2 illustrates a cross section view of an embedded component device, according to an embodiment of the invention.

FIG. 2 illustrates a cross-sectional view of an embedded component device 200, in accordance with one embodiment of the present invention. The cross-sectional view is taken along line A-A of FIG. 1, where the embedded component device 200 is one embodiment of the embedded component device 100. Referring to FIG. 2, the embedded component device 200 includes an electronic component such as a semiconductor device 202, which includes a lower surface 204, an upper surface 206, and lateral surfaces 208 and 210 disposed adjacent to a periphery of the semiconductor device 202 and extending between the lower surface 204 and the upper surface 206. In the illustrated embodiment, each of the surfaces 204, 206, 208, and 210 is substantially planar, with the lateral surfaces 208 and 210 having a substantially orthogonal orientation with respect to the lower surface 204 or the upper surface 206, although it is contemplated that the shapes and orientations of the surfaces 204, 206, 208, and 210 can vary for other implementations. As illustrated in FIG. 2, the lower surface 204 is a back surface of the semiconductor device 202, while the upper surface 206 is an active surface of the semiconductor device 202. In one embodiment, electrical contacts 212a and 212b are disposed adjacent to the upper surface 206. These contacts 212 provide input and output electrical connections for the semiconductor device 202 to conductive structures included in the embedded component device 200, such as a patterned conductive layer 240 (described below). The lower surface 204 may be disposed adjacent to a patterned conductive layer 230 (described below). In one embodiment, an adhesive layer 213 may optionally be added between the lower surface 204 and the patterned conductive layer 230. The adhesive layer 213 may include epoxy, resin, or other suitable materials, and may be a paste. In the illustrated embodiment, the semiconductor device 202 is a semiconductor chip, although it is contemplated that the semiconductor device 202, in general, can be any active device such as an active electronic component, any passive device, or a combination thereof. The semiconductor device 202 may be, for example, a wafer-level package.

FIG. 2 also illustrates a passive electronic component 203 that has electrical contacts 205a and 205b. The passive electronic component 203 may be optionally included in the embedded component device 200. The contacts 205 provide electrical connections for the passive electronic component 203 to, for example, the patterned conductive layers 230 and 240. In one embodiment, an adhesive layer 207 may optionally be added between the passive electronic component 203 and a patterned conductive layer 230. The adhesive layer 207 may include epoxy, resin, or other suitable materials, and may be a paste. It is contemplated that additional semiconductor devices, active devices, and/or passive devices can be included for other implementations.

As illustrated in FIG. 2, the embedded component device 200 also includes a dielectric layer 214 that is disposed adjacent to the semiconductor device 202 and the passive electronic component 203. The dielectric layer 214 has a lower surface 216 and an upper surface 218. In the illustrated embodiment, the dielectric layer 214 substantially covers or encapsulates the semiconductor device 202, the passive electronic component 203, the adhesive layer 213, the adhesive layer 207, and the patterned conductive layer 230 to provide mechanical stability as well as protection against oxidation, humidity, and other environmental conditions. In this embodiment, the dielectric layer 214 substantially covers the upper surface 206 and the lateral surfaces 208 and 210 of the semiconductor device 202. The patterned conductive layer 240 is disposed adjacent to the upper surface 218, and the patterned conductive layer 230 is disposed adjacent to the lower surface 216. While one dielectric layer 214 encapsulating a semiconductor device is illustrated in FIG. 2 as part of the embedded component device 200, it is contemplated that more or less dielectric layers that encapsulate semiconductor devices can be included in an embedded component device in other embodiments.

In one embodiment, an upper dielectric layer 250 may be disposed adjacent to the patterned conductive layer 240 and the upper surface 218 of the dielectric layer 214, and an additional dielectric coating layer 251 may be disposed adjacent to the upper dielectric layer 250. Alternatively or in addition, a lower dielectric layer 260 may be disposed adjacent to the patterned conductive layer 230 and the lower surface 216 of the dielectric layer 214. In one embodiment, an additional dielectric layer 270 may be disposed adjacent to the lower dielectric layer 260. It is contemplated that more or less dielectric layers can be included above and/or below the dielectric layer 214 in other embodiments.

In one embodiment, each of the dielectric layers 214, 250, 260, and 270 can be formed from a dielectric material that is polymeric or non-polymeric. For example, at least one of the dielectric layers 214, 250, 260, and 270 may be formed from, but is not limited to, at least one of liquid crystal polymer (LCP), bismaleimide triazine (BT), prepreg (PP), Ajinomoto Build-up Film (ABF), epoxy, and polyimide. The dielectric layers 214, 250, 260, and 270 can be formed from the same dielectric material or different dielectric materials. For certain implementations, at least one of the dielectric layers 214, 250, 260, and 270 can be formed from a dielectric material that is photoimageable or photoactive. In addition, the dielectric layer 214 may be a resin material reinforced with fibers, such as glass fibers or Kevlar fibers (aramid fibers), to strengthen the dielectric layer 214. Examples of resin materials that may be reinforced by fibers for use in the dielectric layer 214 include ABF, BT, prepreg, polyimide, LCP, epoxy, and other resin materials. As shown in FIG. 6E below, the fibers 290 are initially oriented along a generally horizontal plane within a dielectric layer 614 prior to lamination to form the dielectric layer 214. As shown in FIG. 2, the fibers 290 subsequent to lamination of the dielectric layer 214 are re-oriented, with portions adjacent to the conductive via 224, the semiconductor device 202, and the passive electronic component 203 being pushed along a vertically extending direction of the conductive via 224, the semiconductor device 202, and the passive electronic component 203, and away from the patterned conductive layer 230.

As illustrated in FIG. 2, the dielectric layer 214 is formed so as to define openings 220, 221, 222, and 223. The openings 220 may expose the patterned conductive layer 230. Each opening 220 may also be substantially aligned with a corresponding opening 221 that exposes the patterned conductive layer 240. The openings 222 may expose electrical contacts 212 of the semiconductor device 202. The openings 223 may expose electrical contacts 205 of the passive electronic component 203. A conductive via 224 may substantially fill each opening 220, and an electrical interconnect 225 may substantially fill each opening 221. Alternatively, the conductive via 224 may be located in each opening 220. For example, the conductive via 224 may be a plated conductive post. Although two conductive vias 224 are shown in FIG. 2, it is contemplated that the embedded component device 200 may contain fewer than two or more than two conductive vias 224. The conductive via 224 has an upper surface 233 and a lower surface 234. In one embodiment, the upper surface 233 may be substantially coplanar with the active surface 206 of the semiconductor device 202. Alternatively, if the active surface 206 is facing the patterned conductive layer 230 instead of the patterned conductive layer 240, the upper surface 233 may be substantially coplanar with the back surface 204 of the semiconductor device 202. The conductive via 224 may extend from the patterned conductive layer 230 to the electrical interconnect 225, and the electrical interconnect 225 may extend from the conductive via 224 to the patterned conductive layer 240. This electrically connects (forms a conductive path for current flow between) portions of the patterned conductive layers 230 and 240. An electrical interconnect 226 may substantially fill each opening 222, and an electrical interconnect 227 may substantially fill each opening 223. The electrical interconnect 226 may extend from the electrical contact 212 to the patterned conductive layer 240 to electrically connect the semiconductor device 202 to portions of the patterned conductive layer 230. The electrical interconnect 227 may extend from the electrical contact 205 to the patterned conductive layer 240 to electrically connect the passive electronic component 203 to portions of the patterned conductive layer 240.

In one embodiment, each of the electrical interconnects 225, 226, and 227 has a height in the range from about 30 μm to about 150 μm, such as from about 30 μm to about 50 μm, from about 30 μm to about 100 μm, from about 50 μm to about 100 μm, and from about 100 μm to 150 μm. Each of the electrical interconnects 225, 226, and 227 may be in the range from about 150 μm to 250 μm in diameter, such as about 200 μm in diameter. In one embodiment, each of the conductive interconnects 224 may have a height in the range from about 100 μm to about 500 μm, such as from about 100 μm to about 300 μm, from about 100 μm to about 200 μm, and from about 140 μm to about 160 μm.

In one embodiment, each of the electrical interconnects 225 has an upper surface 231 having a first area and a lower surface 232 having a second area. Similarly, each of the electrical interconnects 226 may have an upper surface 235 having a first area and a lower surface 236 having a second area, and each of the electrical interconnects 227 may have an upper surface 237 having a first area and a lower surface 238 having a second area. In one embodiment, the first area is larger than the second area. In addition, the upper surface 233 of each of the conductive vias 224 has a third area. The diameter of the conductive vias 224 may range from about 150 μm to upwards of about 300 μm. Therefore, in one embodiment, the third area is larger than the second area of the lower surface 232. Alternatively, the third area may be smaller than or equal to the second area of the lower surface 232. In one embodiment, the surfaces 231 through 238 may have a shape including but not limited to a substantially circular shape, a substantially elliptical shape, a substantially square shape, and a substantially rectangular shape.

In one embodiment, a first distance 280 from the upper surface 233 of the conductive via 224 to the patterned conductive layer 240 is less than a second distance 281 from the upper surface 206 of the semiconductor device 202 to the patterned conductive layer 240. Alternatively, the first distance 280 may be greater than or equal to the second distance 281.

By providing electrical connectivity to the patterned conductive layer 240, the electrical interconnects 225, 226 and 227 allow the conductive via 224, the semiconductor device 202, and the passive electronic component 203 to be recessed from the upper surface 218 of the dielectric layer 214. This can facilitate embedding the semiconductor device 202 and the passive electronic component 203 in the dielectric layer 214 to reduce the thickness of the embedded component device 200. In addition, by substantially filling the openings 220, 221, 222, and 223, the conductive vias 224 and the electrical interconnects 225, 226, and 227 may enable enhanced electrical connectivity characteristics. Furthermore, the electrical interconnects 225, 226, and 227 provide electrical connectivity without the need for vias, such as plated through holes. This can significantly reduce the cost of the embedded component device 200.

In one embodiment, the upper dielectric layer 250 may define openings 252 that expose the patterned conductive layer 240. An electrical interconnect 253 may substantially fill each opening 252. The electrical interconnect 253 may have similar characteristics to the conductive via 224, or alternatively may have similar characteristics to the electrical interconnect 225. An additional dielectric layer 251 may be disposed adjacent to the upper dielectric layer 250. The electrical interconnect 253 may extend from the patterned conductive layer 240 to contact pads 254 exposed by openings in the additional dielectric layer 251. The contact pads 254 may be for electrical connection externally to the embedded component device 200. A surface finish layer 255 may be disposed adjacent to each of the contact pads 254.

In one embodiment, a semiconductor device (see semiconductor device 690 in FIG. 6R) electrically connected to the contact pads 254 may also be electrically connected to the semiconductor device 202 on a conductive path including the electrical interconnect 253 and the electrical interconnect 226. The conductive path may also include portions of the patterned conductive layer 240.

In one embodiment, the lower dielectric layer 260 may define openings 262 that expose the patterned conductive layer 230. An electrical interconnect 263 may substantially fill each opening 262. The electrical interconnect 263 may have similar characteristics to the conductive via 224, or alternatively may have similar characteristics to the electrical interconnect 225. An additional dielectric layer 271 may be disposed adjacent to the lower dielectric layer 260. Alternatively, the dielectric layer 270 may be disposed between the lower dielectric layer 260 and the additional dielectric layer 271. Contact pads 274 may be exposed by openings in the additional dielectric layer 271. The contact pads 274 may be for electrical connection externally to the embedded component device 200. A surface finish layer 275 may be disposed adjacent to each of the contact pads 274.

In one embodiment, the semiconductor device 202 may be electrically connected to the contact pads 274 on a conductive path including the electrical interconnect 263. The conductive path may also include one or more of the conductive via 224, the electrical interconnect 225, and the electrical interconnect 226. The conductive path may also include portions of the patterned conductive layer 230.

In one embodiment, each of the patterned conductive layers, electrical interconnects, and conductive vias shown in FIG. 2 can be formed from a metal, a metal alloy, a matrix with a metal or a metal alloy dispersed therein, or another suitable electrically conductive material. For example, each of the patterned conductive layers, electrical interconnects, and conductive vias shown in FIG. 2 can be formed from aluminum, copper, titanium, or a combination thereof. The patterned conductive layers, electrical interconnects, and conductive vias shown in FIG. 2 can be formed from the same electrically conductive material or different electrically conductive materials.

In one embodiment, the surface finish layers 255 and 275 can be formed similarly to the patterned conductive layers, electrical interconnects, and conductive vias shown in FIG. 2, as described previously. Alternatively, the surface finish layers 255 and 275 may be formed differently. For example, the surface finish layers 255 and 275 may be formed from at least one of tin, nickel, and gold, or an alloy including tin or including nickel and gold. The surface finish layers 255 and 275 can be formed from the same electrically conductive material or different electrically conductive materials.

In one embodiment, the additional dielectric layers 251 and 271 can be formed similarly to the dielectric layers 214, 250, 260, and 270, as described previously. The additional dielectric layers 251 and 271 may be formed using solder mask (solder resist), such as dry film imageable solder mask, or another type of patternable layer or dielectric layer. The openings in the additional dielectric layers 251 and 271 that expose the electrical contacts 274 and 275, respectively, can have any of a number of shapes. These shapes include a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of these openings can be curved or roughly textured.

In one embodiment, the lower dielectric layer 260 may be a base substrate 264, such that the base substrate 264 has a single layer. Alternatively, the base substrate 264 may include two or more layers, such as the lower dielectric layer 260 and the additional dielectric layer 270. The base substrate 264 may be coreless. The base substrate 264 may define a cavity (see FIG. 5). Electrical connections through the base substrate 264 may be electrical interconnects such as the electrical interconnect 263. Alternatively or in addition, electrical connections through the base substrate 264 may be plated through vias or other types of electrical connections known in the art.

Figure 3:
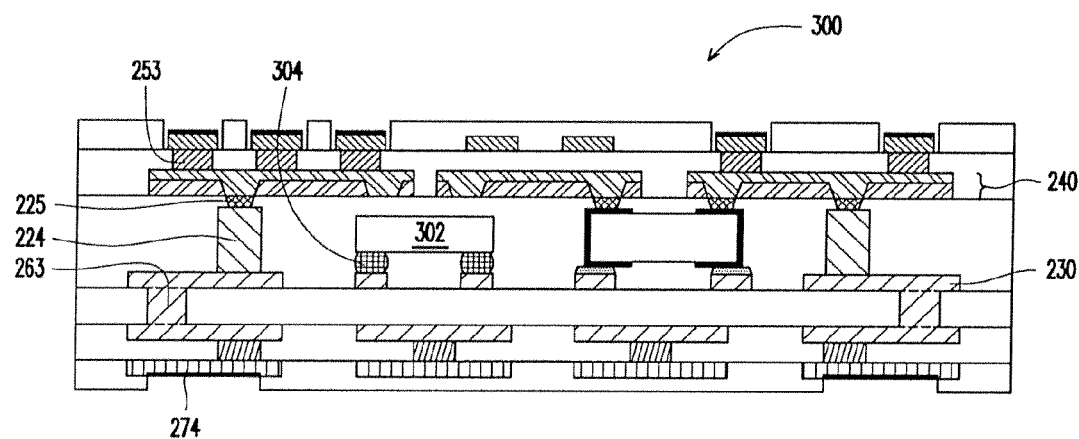
FIG. 3 illustrates a cross section view of an embedded component device, according to an embodiment of the invention.

FIG. 3 illustrates a cross section view of an embedded component device 300, according to an embodiment of the invention. The embedded component device 300 is similar to the embedded component device 200 described with reference to FIG. 2, except that the semiconductor device 302 is flip-chip bonded. Portions of the patterned conductive layer 230 under the semiconductor device 302 may be electrically connected to the die 302 via an fused conductive bump 304, which may be made of a conductive material such as solder.

In one embodiment, a semiconductor device (not shown) electrically connected to the contact pads 254 may be electrically connected to the semiconductor device 302 on a conductive path including the electrical interconnect 253, the electrical interconnect 225, and the conductive via 224. The conductive path may also include portions of the patterned conductive layers 230 and 240 (some portions not shown).

In one embodiment, the semiconductor device 302 may be electrically connected to the contact pads 274 on a conductive path including the electrical interconnect 263. The conductive path may also include portions of the patterned conductive layer 230 (some portions not shown).

Figure 4:
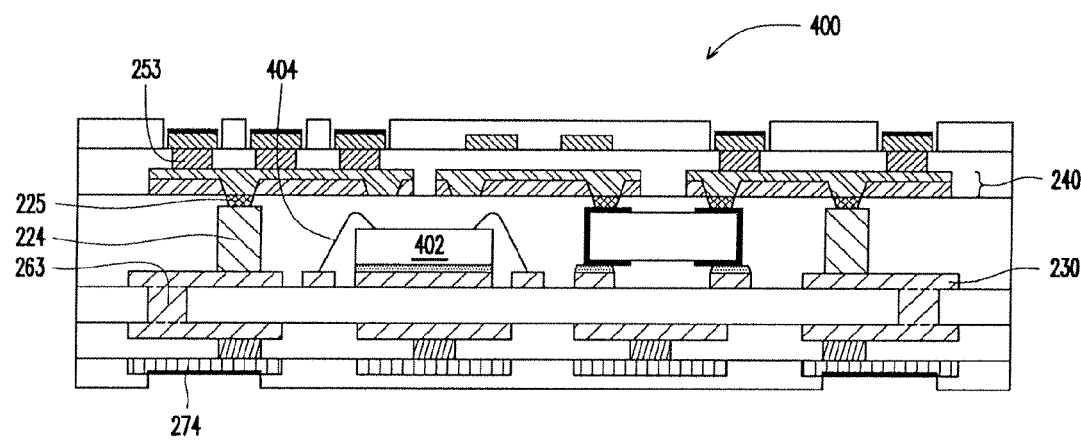
FIG. 4 illustrates a cross section view of an embedded component device, according to an embodiment of the invention.

FIG. 4 illustrates a cross section view of an embedded component device 400, according to an embodiment of the invention. The embedded component device 400 is similar to the embedded component device 200 described with reference to FIG. 2, except that the semiconductor device 402 is wire bonded. Portions of the patterned conductive layer 230 under the semiconductor device 402 may be electrically connected to the die 402 via bonding wires 404.

In one embodiment, a semiconductor device (not shown) electrically connected to the contact pads 254 may be electrically connected to the semiconductor device 402 on a conductive path including the electrical interconnect 253, the electrical interconnect 225, and the conductive via 224. The conductive path may also include portions of the patterned conductive layers 230 and 240 (some portions not shown).

In one embodiment, the semiconductor device 402 may be electrically connected to the contact pads 274 on a conductive path including the electrical interconnect 263. The conductive path may also include portions of the patterned conductive layer 230 (some portions not shown).

Figure 5:
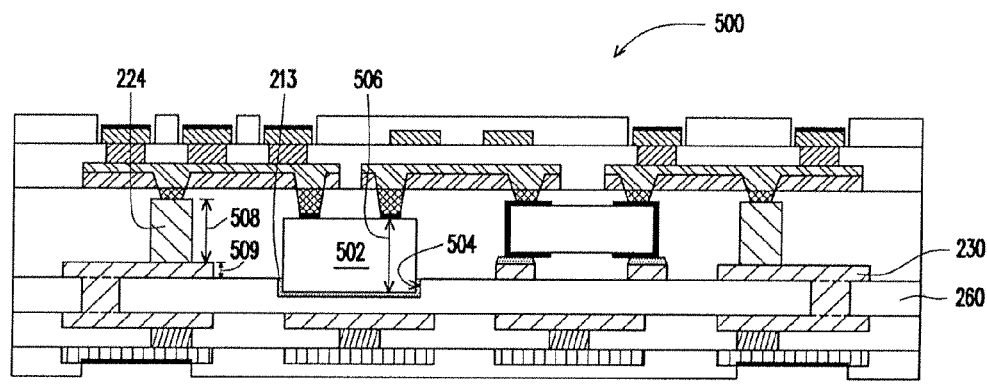
FIG. 5 illustrates a cross section view of an embedded component device, according to an embodiment of the invention.

FIG. 5 illustrates a cross section view of an embedded component device 500, according to an embodiment of the invention. The embedded component device 500 is similar to the embedded component device 200 described with reference to FIG. 2, except that the semiconductor device 502 is at least partially disposed in a cavity 504 defined by the dielectric layer 260. In one embodiment, the adhesive layer 213 is disposed in the cavity 504.

By disposing the semiconductor device 502 in the cavity 504, a taller semiconductor device 502 can be supported in the embedded component device 500 without increasing the overall height of the embedded component device 500 relative to the embedded component device 200. In one example, the semiconductor device 502 has a height 506 that is greater than the sum of a height 508 of the conductive via 224 and a thickness 509 of the patterned conductive layer 230. To avoid increasing the height 508 of the conductive via 224, the semiconductor device 502 may be at least partially disposed in the cavity 504.

Figure 7:
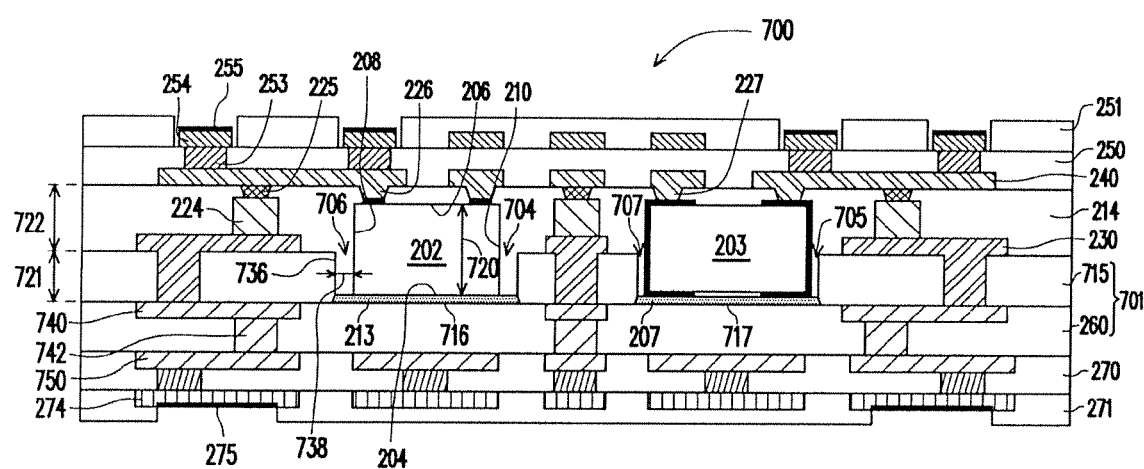
FIG. 7 illustrates a cross section view of an embedded component device, according to an embodiment of the invention.

FIG. 7 illustrates a cross section view of an embedded component device 700, according to an embodiment of the invention. The embedded component device 700 is similar to the embedded component device 200 described with reference to FIG. 2, except that the semiconductor device 202 is at least partially disposed in an opening 704 extending through a dielectric layer 715. Also, the passive electronic component 203 is at least partially disposed in an opening 705 extending through the dielectric layer 715 and exposing the dielectric layer 260. (Note that as used in this specification, a "semiconductor device" can be any active device, any passive device, or a combination thereof.) In one embodiment, the semiconductor device 202 is disposed adjacent to the dielectric layer 260. The adhesive layer 213 may be disposed between the semiconductor device 202 and the dielectric layer 260. In one embodiment, the passive electronic component 203 is disposed adjacent to the dielectric layer 260. In one embodiment, the adhesive layer 207 is disposed between the passive electronic component 203 and the dielectric layer 260. The dielectric layer 715 otherwise has similar characteristics to those previously described for the dielectric layer 260.

As used in this specification, a single dielectric layer can include multiple dielectric layers formed during manufacturing. For example, a dielectric layer 701 includes the dielectric layers 715 and 260. The opening 704 in the dielectric layer 715 can also be referred to as a cavity 706 in the dielectric layer 701, the cavity 706 having a cavity bottom 716. The opening 705 in the dielectric layer 715 can also be referred to as a cavity 707 in the dielectric layer 701, the cavity 707 having a cavity bottom 717. The semiconductor device 202 is disposed adjacent to the cavity bottom 716, and the passive electronic component 203 is disposed adjacent to the cavity bottom 717. The cavity bottom 716 and the cavity bottom 717 may each include at least a portion of a surface of the dielectric layer 260.

By disposing the semiconductor device 202 in the cavity 706, a taller semiconductor device 202 can be supported in the embedded component device 700 without increasing the overall height of the embedded component device 700 relative to the embedded component device 200. In one example, this is achieved by partially disposing the semiconductor device 202 in the cavity 706. For example, the semiconductor device 202 may have a height 720 that is greater than a height 721 of the cavity 706, but that is less than the sum of the height 721 and a thickness 722 (above the cavity 706) of the dielectric layer 214.

Also, the cavity 706 is positioned such that none of the surfaces of the semiconductor device 202 are exposed at an external surface of the embedded component device 700. In one embodiment, the semiconductor device 202 is covered by the dielectric layer 214. This can provide mechanical stability as well as protect the semiconductor device 202 against oxidation, humidity, and other environmental conditions. Specifically, at least a portion of the upper (active) surface 206 of the semiconductor device 202 may be substantially covered by the dielectric layer 214. The dielectric layer 214 may also cover the lateral surfaces 208 and 210 of the semiconductor device 202. The lower (back) surface 204 of the semiconductor device 202 may be disposed adjacent to the cavity bottom 716 and/or the dielectric layer 260.

The embedded component device 700 also includes a conductive via 741 extending through the dielectric layer 715 and connecting the patterned conductive layer 230 to a patterned conductive layer 740. The patterned conductive layer has a lower surface 741. In one embodiment, the lower surface 204 of the semiconductor device 202 is lower than the lower surface 741 of the patterned conductive layer 230. The patterned conductive layer 740 is between the dielectric layer 715 and the dielectric layer 260. A conductive via 742 extends through the dielectric layer 260 and connects the patterned conductive layer 740 to a patterned conductive layer 750. The patterned conductive layer 750 is between the dielectric layer 260 and the dielectric layer 270. The remaining elements marked in FIG. 7 are described with reference to FIG. 2.

In one embodiment, the thickness 722 of the dielectric layer 214 is in the range from about 10 μm to about 150 μm, such as from about 10 μm to about 120 μm, from about 10 μm to about 100 μm, from about 30 μm to about 100 μm, and from about 50 μm to about 100 μm.

In one embodiment, a distance 738 from a lateral surface 736 of the cavity 716 to the nearest lateral surface 208 of the semiconductor device 202 is in the range from about 10 μm to about 100 μm, such as from about 10 μm to about 50 μm, from about 30 μm to about 50 μm, and from about 50 μm to about 100 μm. The advantage of reducing the distance 738 is that this can reduce the amount of encapsulant needed to fill the space in the cavity 716 between the semiconductor device 202 and the lateral surface 736. On the other hand, the distance 738 should be greater than some minimum tolerance related to the precision with which the cavity 716 and the semiconductor device 202 can be positioned during manufacturing. In another embodiment, the distance 738 may be greater than 100 μm.

Figure 8:
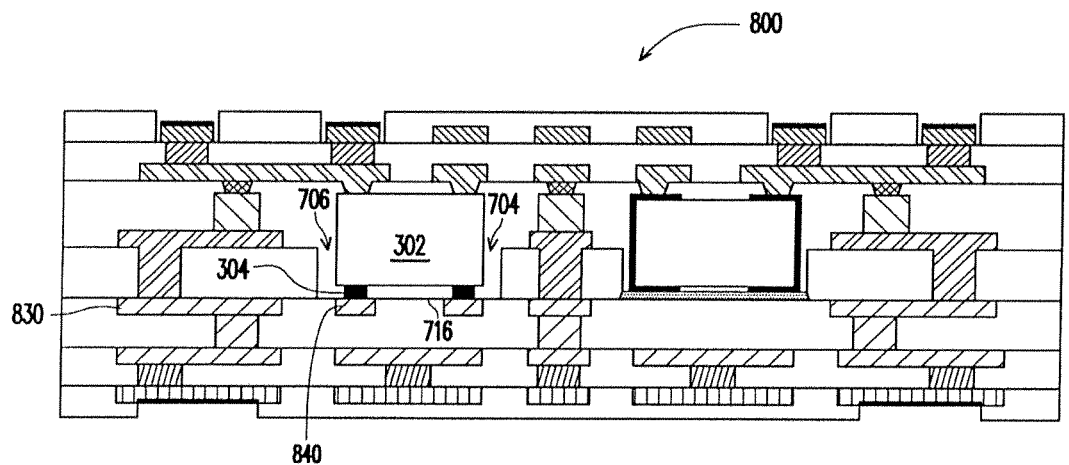
FIG. 8 illustrates a cross section view of an embedded component device, according to an embodiment of the invention.

FIG. 8 illustrates a cross section view of an embedded component device 800, according to an embodiment of the invention. The embedded component device 800 is similar to the embedded component device 700 described with reference to FIG. 7, except that the semiconductor device 302 is flip-chip bonded. A portion 840 of a patterned conductive layer 830 may be exposed by the opening 704, and may be exposed at the cavity bottom 716 of the cavity 706. The patterned conductive layer 830 otherwise has similar characteristics to those previously described for the patterned conductive layer 230. The electrical contact 304 of the semiconductor device 302 may be disposed adjacent to the portion 840. In one embodiment, the portion 840 may be electrically connected to the semiconductor device 302 via a fused conductive bump 304, which may be made of a conductive material such as solder.

Figure 9:
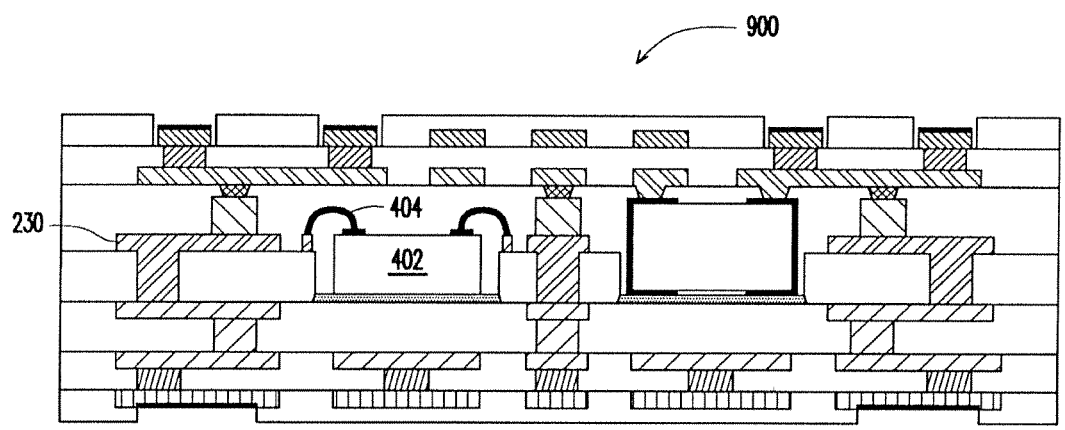
FIG. 9 illustrates a cross section view of an embedded component device, according to an embodiment of the invention.

FIG. 9 illustrates a cross section view of an embedded component device 900, according to an embodiment of the invention. The embedded component device 900 is similar to the embedded component device 700 described with reference to FIG. 7, except that the semiconductor device 402 is wire bonded. Portions of the patterned conductive layer 230 may be electrically connected to the semiconductor device 402 via the bonding wires 404.

Figure 10:
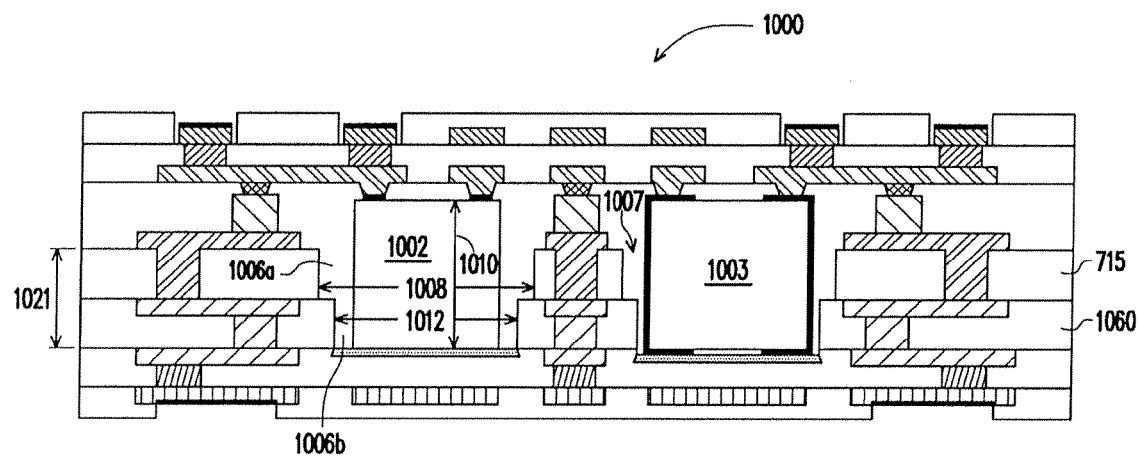
FIG. 10 illustrates a cross section view of an embedded component device, according to an embodiment of the invention.

FIG. 10 illustrates a cross section view of an embedded component device 1000, according to an embodiment of the invention. The embedded component device 1000 is similar to the embedded component device 700 described with reference to FIG. 7, except that a semiconductor device 1002 is at least partially disposed in a two-layer cavity 1006. Also, a passive electronic component 1003 is at least partially disposed in a two-layer cavity 1007. The semiconductor device 1002 has similar characteristics to the semiconductor device 202, respectively, except that a height 1010 of the semiconductor device 1002 is greater than the height 210 of the semiconductor device 202. The two-layer cavity 1006 has similar characteristics to the two-layer cavity 1007, so only the two-layer cavity 1006 is further described here. The two-layer cavity 1006 has an upper portion 1006a defined by the dielectric layer 715, and a lower portion 1006b defined by a dielectric layer 1060. The dielectric layer 1060 otherwise has similar characteristics to those previously described for the dielectric layer 260. The upper portion 1006a extends through the dielectric layer 715, and the lower portion 1006b extends through the dielectric layer 1060, so the two-layer cavity 1006 extends through two dielectric layers.

A height 1021 of the two-layer cavity 1006 can be greater than the height 721 of the single-layer cavity 706. By disposing the semiconductor device 1002 in the two-layer cavity 1006, it is possible to support the semiconductor device 1002 without increasing (or even when decreasing) the overall height of the embedded component device 1000 relative to the embedded component device 700. In other embodiments, it is contemplated that the cavity may extend through more than two dielectric layers.

In one embodiment, a width 1008 of the upper portion 1006a is greater than a width 1012 of the upper portion 1006b by an amount less than or equal to about 50 μm, such as from about 10 μm to about 20 μm, from about 10 μm to about 30 μm, and from about 10 μm to about 50 μm.

Figure 6A:
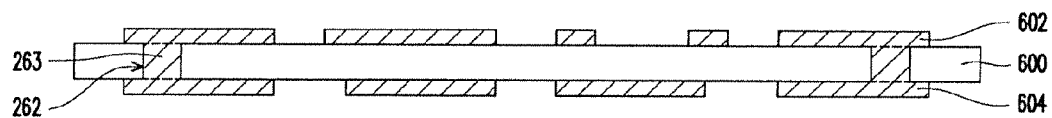
FIG. 6A through FIG. 6R illustrate a method of manufacturing an embedded component device, according to an embodiment of the invention.
Figure 6B:
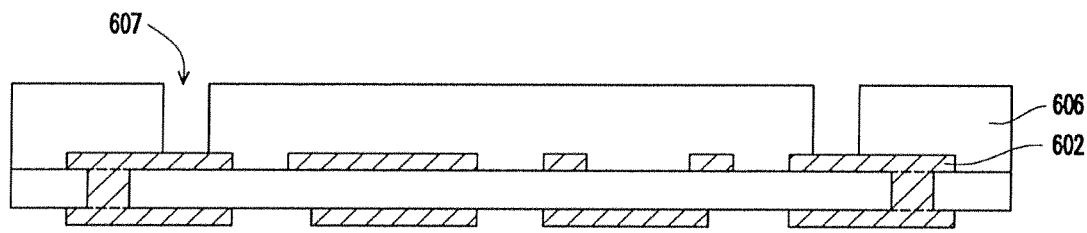
Figure 6C:
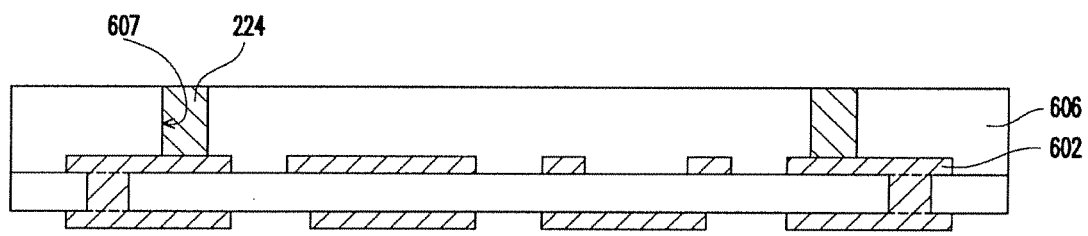
Figure 6D:
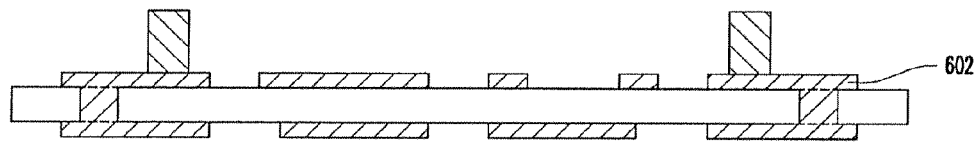
Figure 6E:
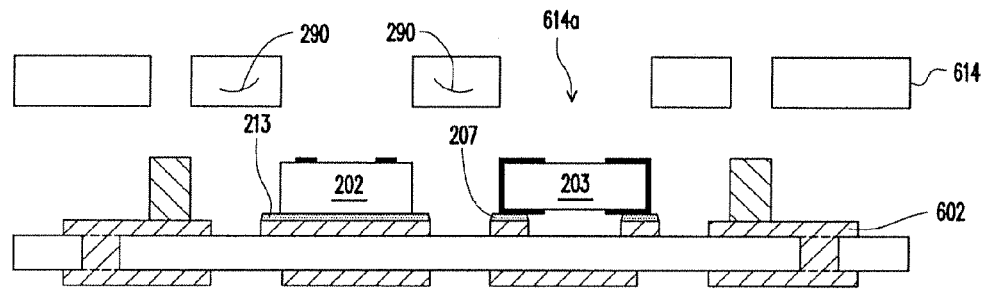
Figure 6F:
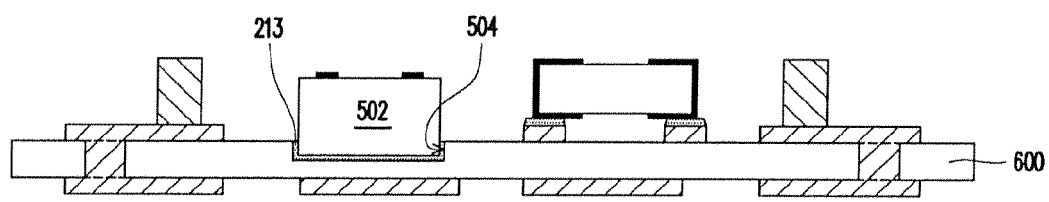
Figure 6G:
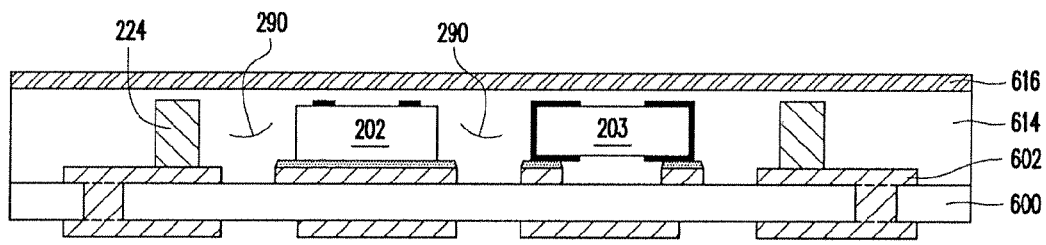
Figure 6H:
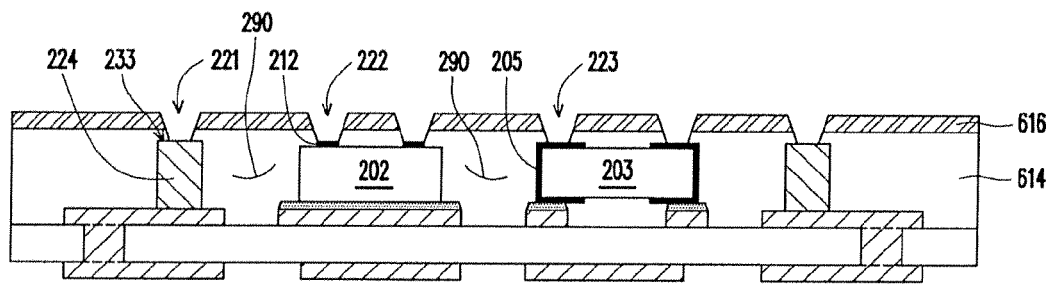
Figure 6I:
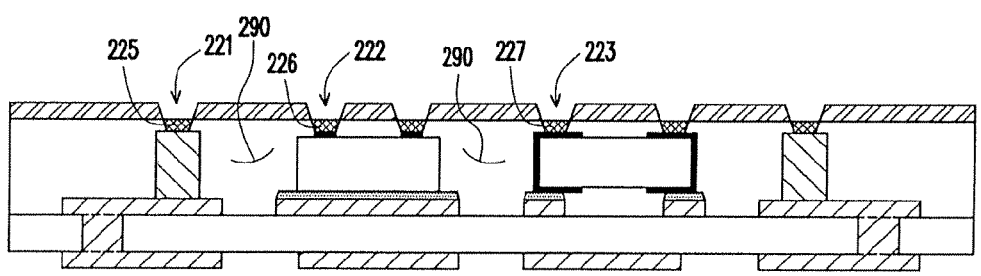
Figure 6J:
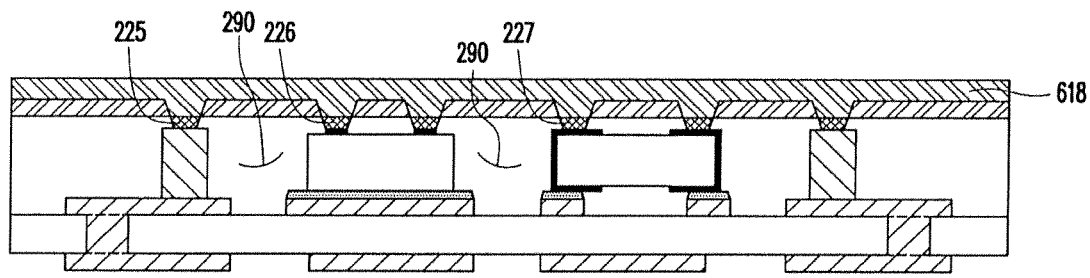
Figure 6K:
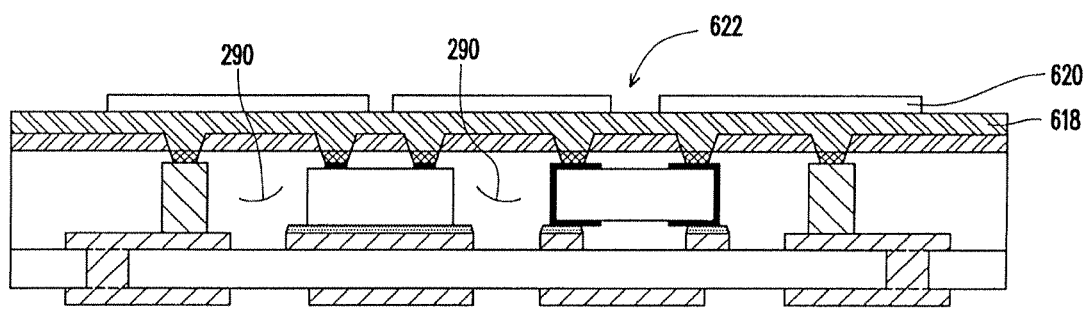
Figure 6L:
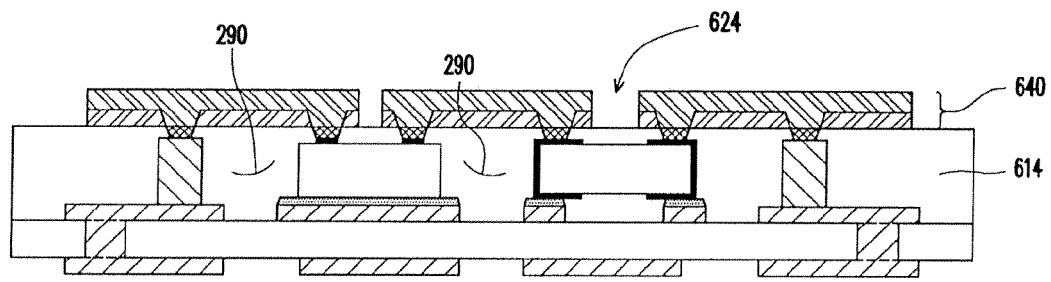
Figure 6M:
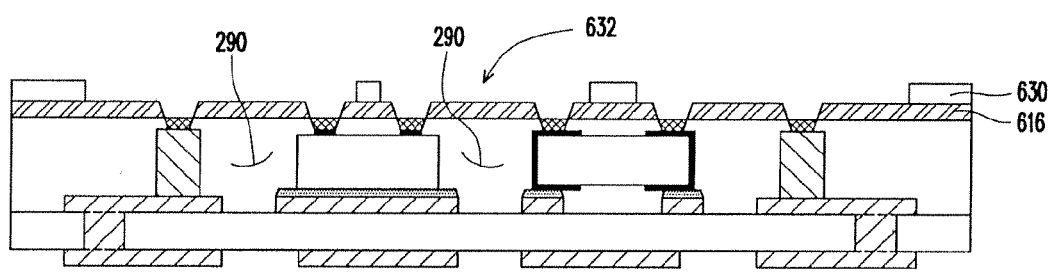
Figure 6N:
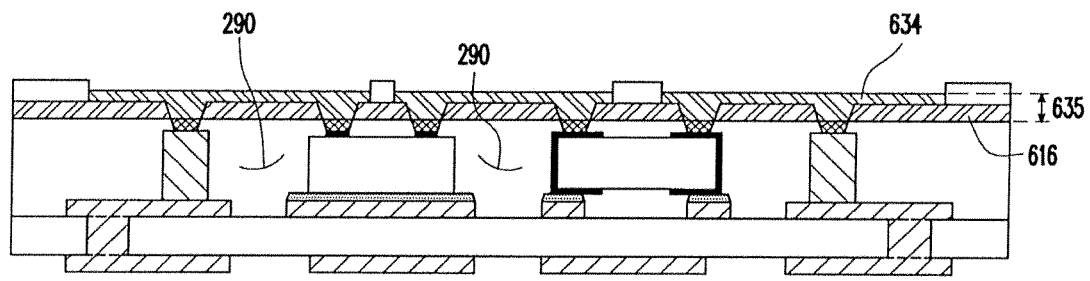
Figure 6O:
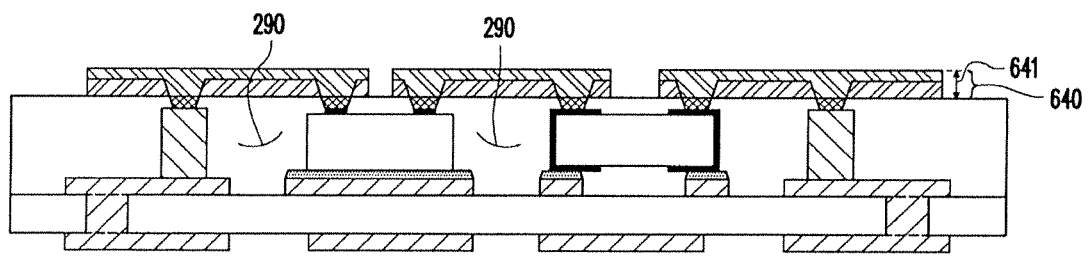
Figure 6P:
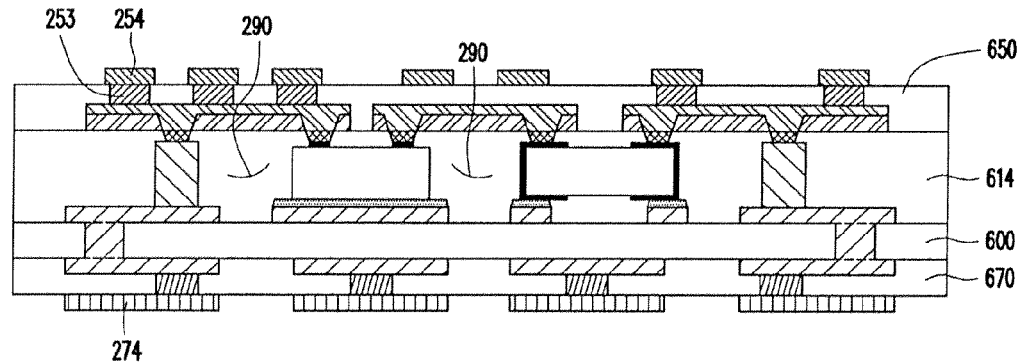
Figure 6Q:
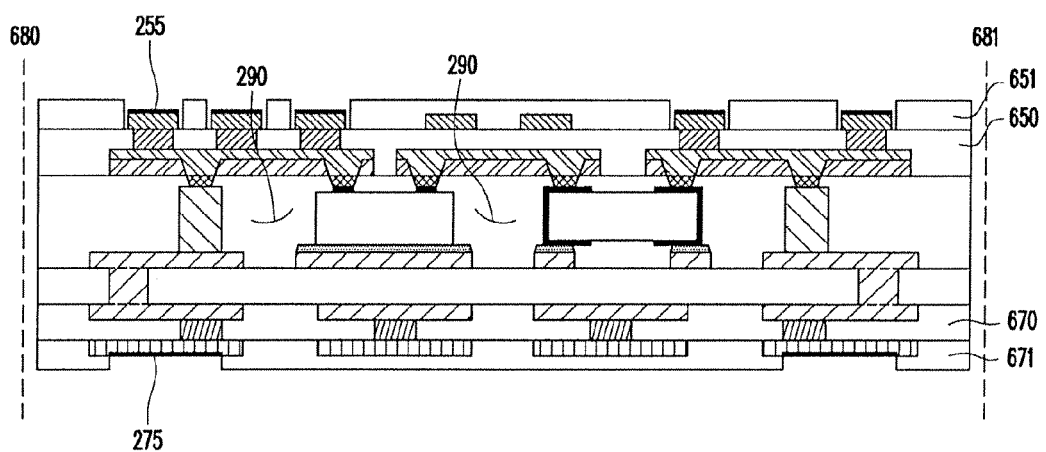
Figure 6R:
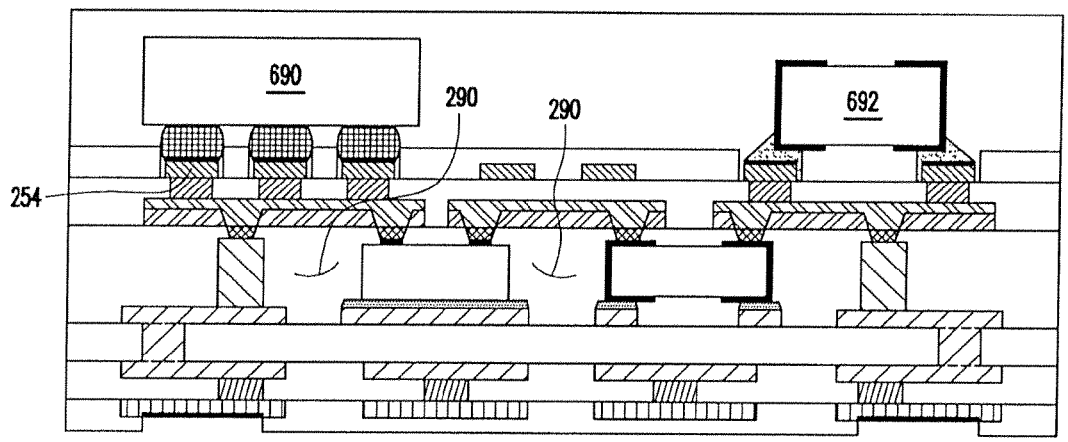

FIGS. 6A through 6R illustrate a method of manufacturing an embedded component device, according to an embodiment of the invention. For ease of presentation, the following manufacturing operations are described with reference to the embedded component device 200 of FIG. 2. However, it is contemplated that the manufacturing operations can be similarly carried out to form other embedded component devices that may have different internal structure from the embedded component device 200, such as the embedded component devices illustrated in FIGS. 3-5. It is also contemplated that the manufacturing operations can be carried out to form a substrate strip including an array of connected embedded component devices, each of which may correspond to an embedded component device such as those illustrated in FIGS. 1-5. As described in FIG. 6Q, the array of connected embedded component devices may be singulated into individual embedded component devices such as those illustrated in FIGS. 1-5.

Referring first to FIG. 6A, a base substrate strip 600 is provided, the portion shown in FIG. 6A corresponding to the base substrate 264 of FIG. 2. Patterned conductive layers 602 and 604 are disposed adjacent to the base substrate 600. The portion of the patterned conductive layer 602 shown in FIG. 6A corresponds to the patterned conductive layer 230 of FIG. 2. The base substrate strip 600 defines the openings 262. The conductive interconnects 263 extend between the patterned conductive layers 602 and 604, and substantially fill the openings 262. Each of the patterned conductive layers 602 and 604 may have a thickness in the range from about 10 μm to about 30 μm, such as in the range from about 15 μm to about 25 μm.

Next, as illustrated in FIG. 6B, a photoresist material may be formed adjacent to the patterned conductive layer 602. The photoresist material may be a dry film photoresist, or another type of patternable layer or dielectric layer. The photoresist layer 606 may be formed by coating, printing, or any other suitable technique. Predetermined or selected portions of the photoresist layer 606 may be photoimaged and developed so as to create openings 607 exposing the patterned conductive layer 602. The photoresist layer 606 may be photochemically defined using a photomask (not shown). Photoimaging and developing may have advantages of lower cost and decreased process time as compared to other approaches for creating openings in the photoresist layer 606. The resulting openings can have any of a number of shapes, including a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

Next, as illustrated in FIG. 6C, an electrically conductive material is applied into the openings 607 defined by the photoresist layer 606 to form the conductive vias 224 extending vertically from the patterned conductive layer 602. The conductive vias 224 may be formed using any of a number of coating techniques, such as chemical vapor deposition, electroless plating, electrolytic plating, printing, spinning, spraying, sputtering, or vacuum deposition.

Next, as illustrated in FIG. 6D, the photoresist layer 606 is stripped to expose the patterned conductive layer 602.

Next, as illustrated in FIG. 6E, the semiconductor device 202 is disposed adjacent to the patterned conductive layer 602. The adhesive layer 213 may be disposed between the semiconductor device 202 and the patterned conductive layer 602. The passive electronic component 203 is disposed adjacent to the patterned conductive layer 602. The adhesive layer 207 may be disposed between the passive electronic component 203 and the patterned conductive layer 602.

Alternatively, as illustrated in FIG. 6F, the cavity 504 may be formed in the base substrate strip 600. The semiconductor device 502 may be at least partially disposed in the cavity 504. In one embodiment, the adhesive layer 213 is disposed in the cavity 504.

Referring to FIG. 6E, a dielectric layer 614 is provided, wherein the dielectric layer 614 is pre-formed with a set of first openings 614a, and positions of the first openings 614a respectively correspond to positions of the conductive via 224, the semiconductor device 202, and the passive electronic component 203. In one embodiment, the dielectric layer 614 includes a fiber-reinforced resin material, such as a prepreg material, including the fibers 290 to strengthen the dielectric layer 614. As shown in FIG. 6E, the fibers 290 are initially oriented along a generally horizontal plane within the dielectric layer 614. While the openings 614a are shown in FIG. 6E as fully extending through the dielectric layer 614, it is contemplated that the openings 614a also can partially extend through the dielectric layer 614.

Next, as illustrated in FIG. 6G, the dielectric layer 614 is disposed adjacent to the base substrate strip 600, and covering the semiconductor device 202, the passive electronic component 203, and the conductive vias 224. The dielectric layer 614 may also cover the patterned conductive layer 602. The dielectric layer 614 may separate a conductive sheet 616 from the semiconductor device 202, the passive electronic component 203, and the conductive vias 224. The portion of the dielectric layer 614 shown in FIG. 6G corresponds to the dielectric layer 214 of FIG. 2. In one embodiment, the fibers 290 subsequent to lamination of the dielectric layer 614 are re-oriented, with portions adjacent to the conductive via 224, the semiconductor device 202, and the passive electronic component 203 being pushed along a vertically extending direction of the conductive via 224, the semiconductor device 202, and the passive electronic component 203, and away from the patterned conductive layer 230. A conductive sheet 616, such as a copper foil, may be disposed adjacent to the dielectric layer 614 to form, for example, a resin-coated copper layer that covers the semiconductor device 202, the passive electronic component 203, and the conductive vias 224. The dielectric layer 614 may have a single resin layer, or may include a first sublayer made of resin and a second sublayer made of reinforced resin, such as resin reinforced with glass fibers and/or Kevlar fibers.

In another embodiment, the dielectric layer 614 may be formed from a prepreg material, and the conductive sheet 616 may be disposed adjacent to the dielectric layer 614. The prepreg material may be disposed adjacent to the base substrate strip 600, and may be pre-formed to define openings at the locations of the semiconductor device 202, the passive electronic component 203, and the conductive vias 224. In addition, the prepreg material may cover the semiconductor device 202, the passive electronic component 203, and the conductive vias 224. The prepreg material may be formed of one prepreg layer, or of two or more prepreg layers. Alternatively, the dielectric layer 614 may include a combination of a prepreg sublayer and a resin sublayer, and the conductive sheet 616 may be disposed adjacent to the dielectric layer 614. The prepreg sublayer may be disposed adjacent to the base substrate strip 600, and may be pre-formed to define openings at the locations of the semiconductor device 202, the passive electronic component 203, and the conductive vias 224. The resin sublayer may be disposed adjacent to the prepreg sublayer, and may also be disposed adjacent to the base substrate strip 600 within the openings defined by the prepreg sublayer.

In another embodiment, the dielectric layer may be formed from an epoxy molding compound, such as an encapsulant material, and the conductive sheet 616 may be disposed adjacent to the dielectric layer 614.

In one embodiment, the dielectric layer 614 may be laminated on the base substrate strip 600. Alternatively, the dielectric layer 614 can be formed using any of a number of molding techniques, such as injection molding. Once applied, the molding material is hardened or solidified, such as by lowering the temperature to below a melting point of the molding material, thereby forming the dielectric layer 614. Alternatively, the dielectric layer 614 can be formed using any of a number of coating techniques, such as printing, spinning, or spraying.

In one embodiment, the conductive sheet 616 may be attached to the dielectric layer 614 prior to disposing the dielectric layer 614 adjacent to the base substrate strip 600. In one embodiment, the dielectric layer 614, with the conductive sheet 616 already attached, may be disposed adjacent to the base substrate strip 600.

Next, as illustrated in FIG. 6H, openings including the openings 221, 222, and 223 are formed. The openings 221 extend through the conductive sheet 616 and the dielectric layer 614 to expose the upper surface 233 of each of the conductive vias 224. The openings 222 extend through the conductive sheet 616 and the dielectric layer 614 to expose the electrical contacts 212 of the semiconductor device 202. The openings 223 extend through the conductive sheet 616 and the dielectric layer 614 to expose the electrical contacts 205 of the passive electronic component 203. The openings 221, 222, and 223 may be formed by laser drilling, or other suitable approaches known in the art.

Next, as illustrated in FIG. 6I, the openings 221, 222, and 223 are filled with a conductive material to form conductive vias, such as the electrical interconnects 225, 226, and 227 of FIG. 2. The electrical interconnects 225, 226, and 227 may be formed using any of a number of coating techniques, such as electroless plating and/or electrolytic plating.

Next, a subtractive process for forming a patterned conductive layer including the patterned conductive layer 240 of FIG. 2 is illustrated in FIGS. 6J through 6L. In FIG. 6J, additional conductive material is disposed adjacent to the electrical interconnects 225, 226, and 227, and adjacent to the conductive sheet 616. This additional conductive material forms a conductive layer 618 that is electrically connected to the electrical interconnects 225, 226, and 227.

In FIG. 6K, a photoresist layer 620 is formed adjacent to the conductive layer 618. Predetermined or selected portions of the photoresist layer 620 may be photoimaged and developed so as to create openings 622. The openings 622 expose the conductive layer 618. The photoresist layer 620 (and the openings 622) have similar characteristics and are formed similarly to the photoresist layer 606 (and the openings 607) described with reference to FIG. 6B.

In FIG. 6L, openings 624 exposing the dielectric layer 614 are formed in the conductive layer 618 to form a patterned conductive layer 640. The portion of the patterned conductive layer 640 shown in FIG. 6L corresponds to the patterned conductive layer 240 of FIG. 2. Patterning to form the patterned conductive layer 640 can be carried out in any of a number of ways, such as chemical etching, laser drilling, or mechanical drilling, and the resulting openings can have any of a number of shapes, such as a cylindrical shape, such as a circular cylindrical shape, an elliptic cylindrical shape, a square cylindrical shape, or a rectangular cylindrical shape, or a non-cylindrical shape, such as a cone, a funnel, or another tapered shape. It is also contemplated that lateral boundaries of the resulting openings can be curved or roughly textured.

As an alternative to the subtractive process illustrated in FIGS. 6J through 6L, a modified semi-additive process (MSAP) for forming a patterned conductive layer including the patterned conductive layer 240 of FIG. 2 is illustrated in FIGS. 6M through 6O. The MSAP is used to form a patterned conductive layer with finer pitch, narrower traces than the subtractive process. In FIG. 6M, a photoresist layer 630 is formed adjacent to the conductive sheet 616. Predetermined or selected portions of the photoresist layer 630 may be photoimaged and developed so as to create openings 632. The openings 632 expose the conductive sheet 616. The photoresist layer 630 (and the openings 632) have similar characteristics and are formed similarly to the photoresist layer 606 (and the openings 607) described with reference to FIG. 6B.

In FIG. 6N, additional conductive material is disposed adjacent to the electrical interconnects 225, 226, and 227, and adjacent to the conductive sheet 616. This additional conductive material forms a conductive layer 634 that is electrically connected to the electrical interconnects 225, 226, and 227. The combination of the conductive sheet 616 and the conductive layer 634 has a thickness 635.

In FIG. 6O, the patterned photoresist layer 630 is removed. Then, a portion of the conductive layer 634 is removed, such as by flash etching, to form the patterned conductive layer 640. As a result of the flash etching, a thickness 641 of the patterned conductive layer 640 may be reduced from the thickness 635 illustrated in FIG. 6N.

Next, as illustrated in FIG. 6P, a dielectric layer 650 is disposed adjacent to the dielectric layer 614, and a dielectric layer 670 is disposed adjacent to the base substrate strip 600. The portions of the dielectric layers 650 and 670 shown in FIG. 6P correspond to the dielectric layers 250 and 270 of FIG. 2, respectively. The dielectric layers 650 and 670 may be formed in a manner similar to that described previously for the dielectric layer 614 with reference to FIG. 6G. The electrical interconnects extending through the dielectric layers 650 and 670, such as the electrical interconnects 253, may be formed in a manner similar to that described previously for the conductive vias 224 with reference to FIG. 6C. The electrical contacts 254 and 274 may be formed in a manner similar to that described previously for the patterned conductive layer 640 with reference to FIGS. 6K and 6L.

Next, as illustrated in FIG. 6Q, a dielectric layer 651 is disposed adjacent to the dielectric layer 650, and a dielectric layer 671 is disposed adjacent to the dielectric layer 670. The portions of the dielectric layers 651 and 671 shown in FIG. 6P correspond to the dielectric layers 251 and 271 of FIG. 2, respectively. The dielectric layers 651 and 671 may be formed in a manner similar to that described previously for the dielectric layer 614 with reference to FIG. 6G. The surface finish layers 255 and 275 may be formed in a manner similar to that described previously for the conductive vias 224 with reference to FIG. 6C. Singulation may then be performed along the dashed lines 680 and 681 to obtain individual embedded component devices, such as the embedded component device 200 of FIG. 2.

Next, as illustrated in FIG. 6R, a second semiconductor device 690 and a passive electronic component 692 may be electrically connected to the electrical contacts 254.

Figure 11A:
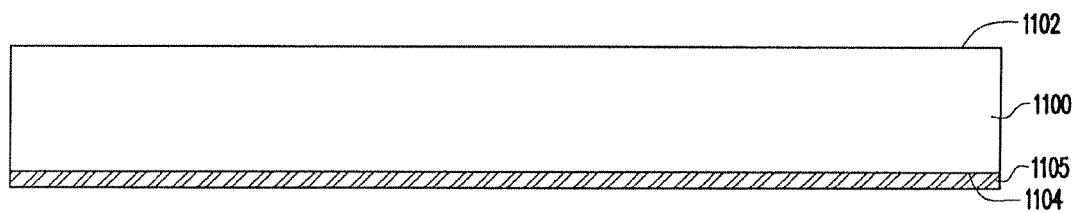
FIG. 11A through FIG. 11S illustrate a method of manufacturing an embedded component device, according to an embodiment of the invention.
Figure 11B:
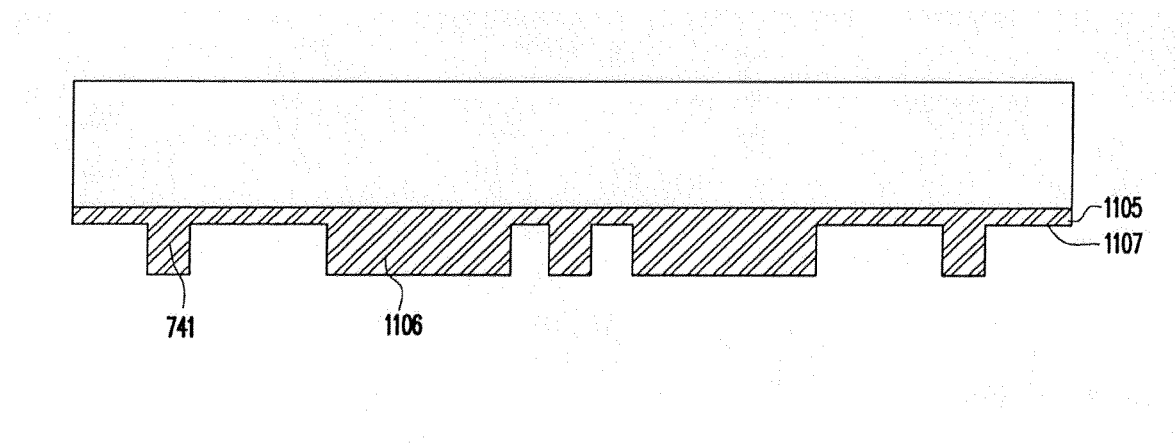
Figure 11C:
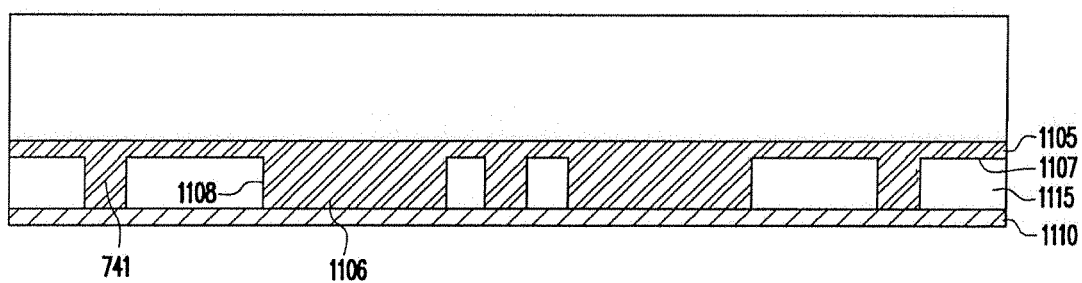
Figure 11D:
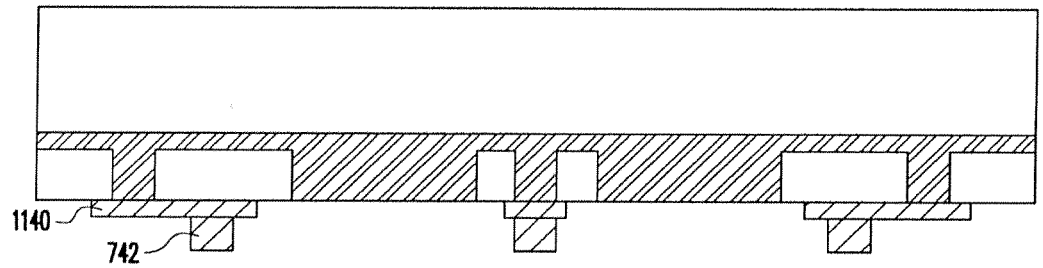
Figure 11E:
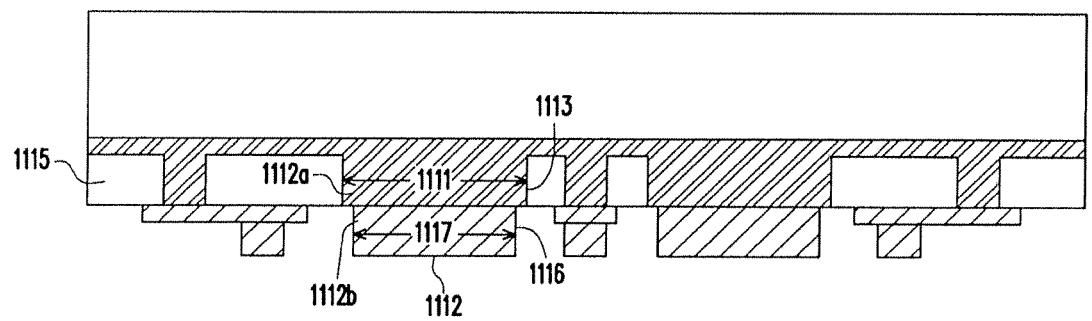
Figure 11F:
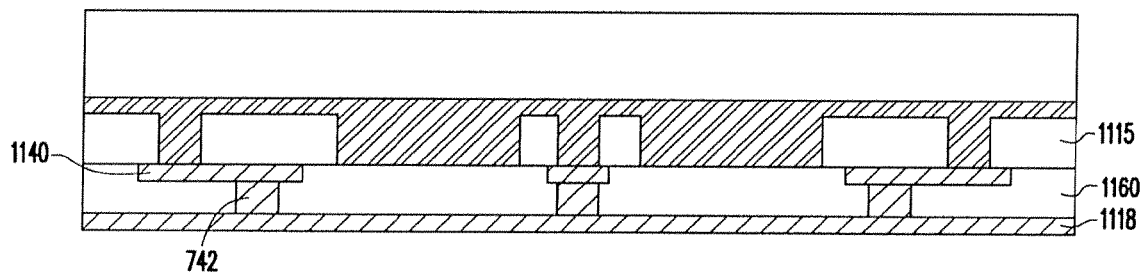
Figure 11G:
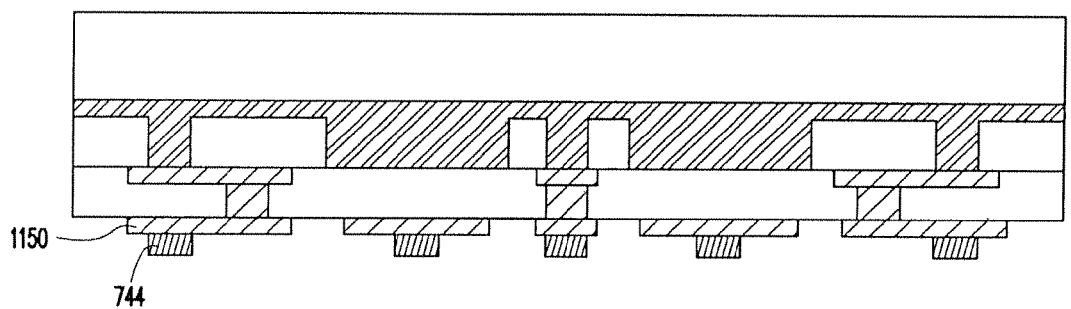
Figure 11H:
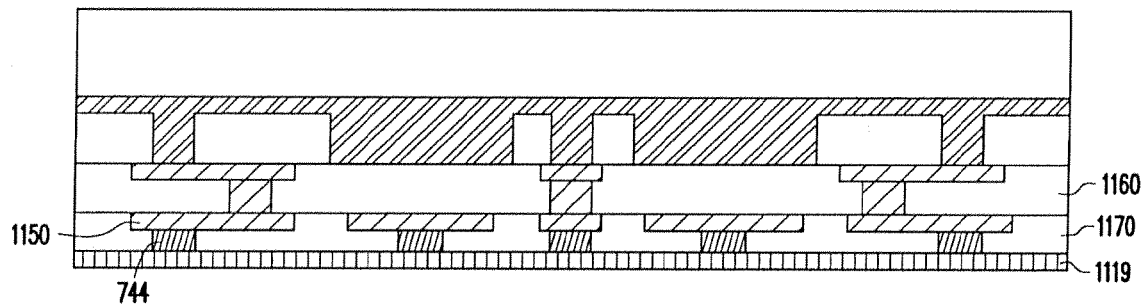
Figure 11I:
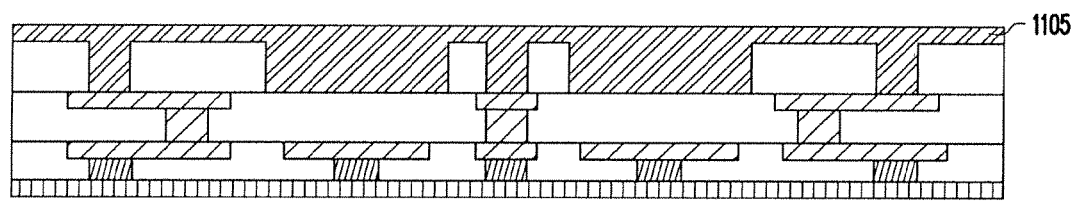
Figure 11J:
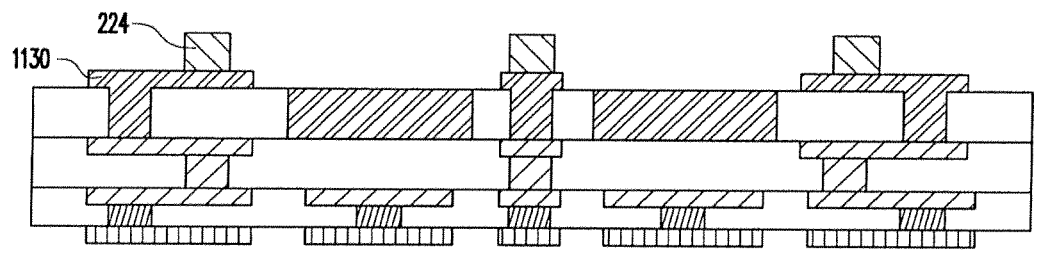
Figure 11K:
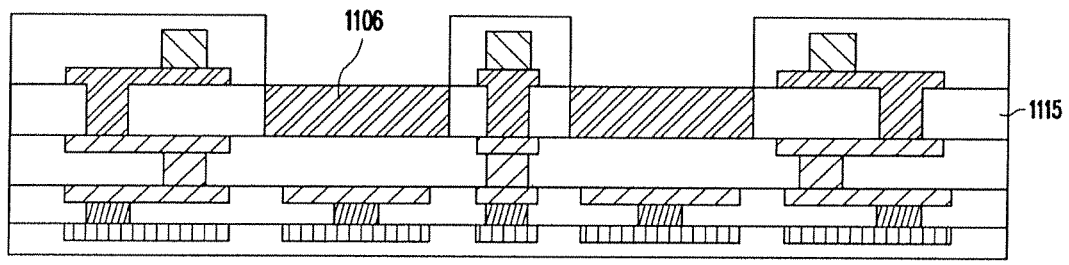
Figure 11L:
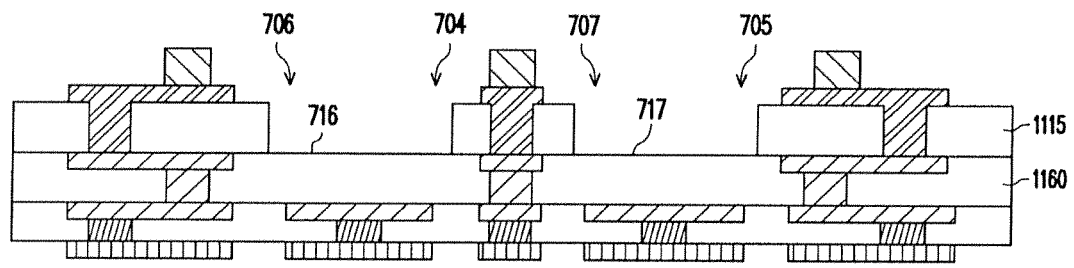
Figure 11M:
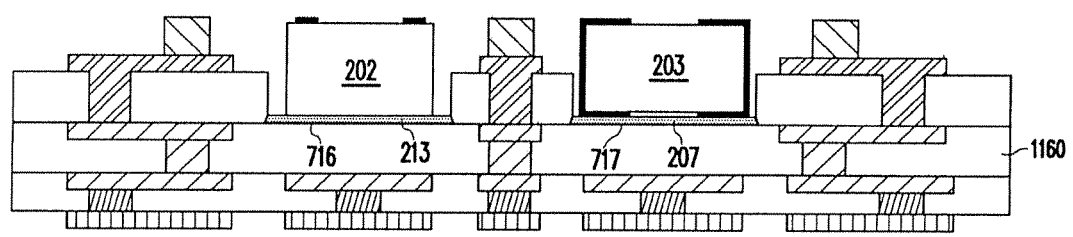
Figure 11N:
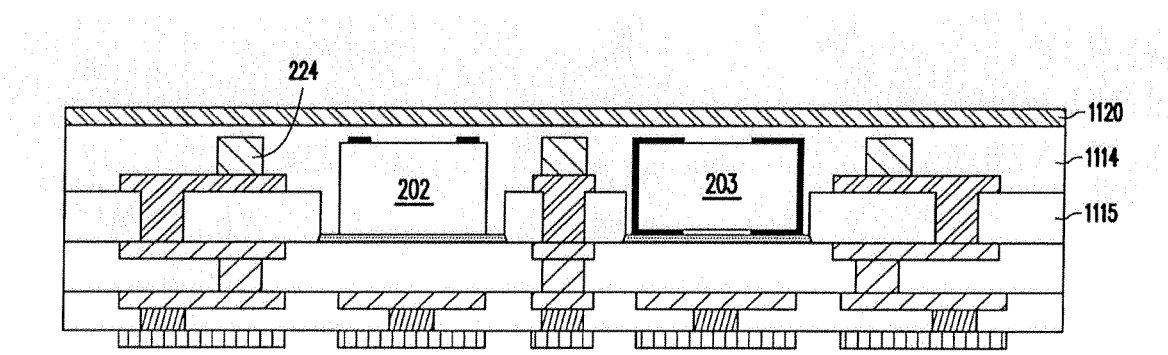
Figure 11O:
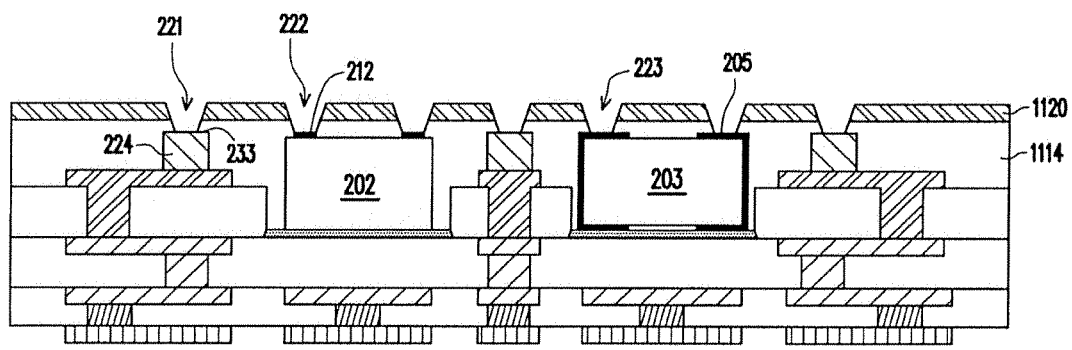
Figure 11P:
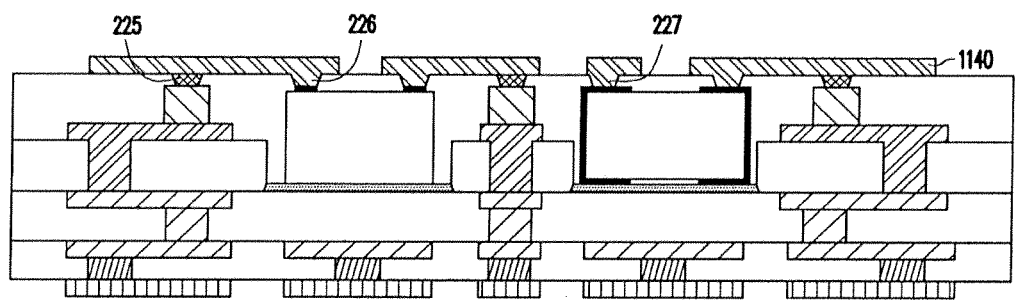
Figure 11Q:
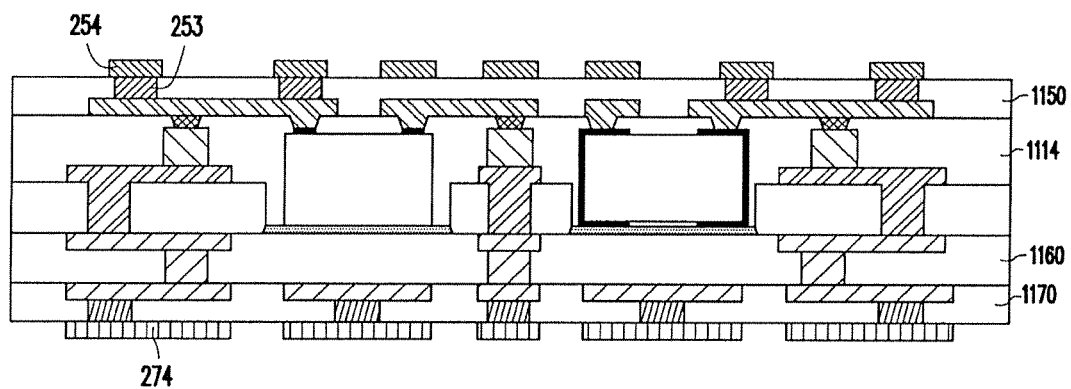
Figure 11R:
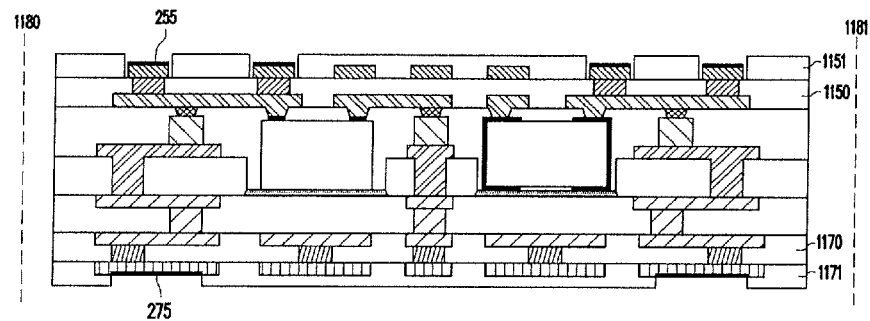
Figure 11S:
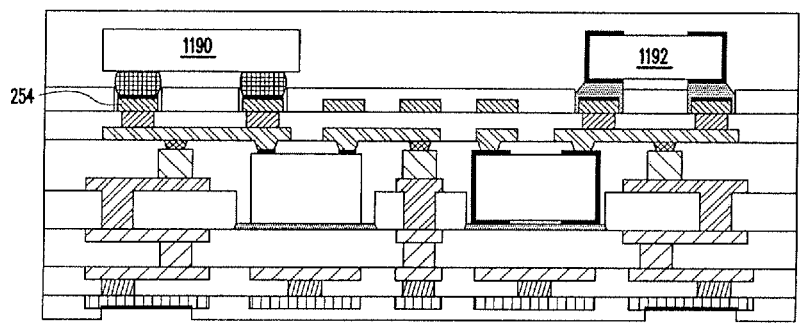

FIGS. 11A through 11S illustrate a method of manufacturing an embedded component device, according to an embodiment of the invention. For ease of presentation, the following manufacturing operations are described with reference to the embedded component device 700 of FIG. 7, which includes aspects of the embedded component device 200 of FIG. 2. However, it is contemplated that the manufacturing operations can be similarly carried out to form other embedded component devices that may have different internal structure from the embedded component device 700, such as the embedded component devices illustrated in FIGS. 8-10. It is also contemplated that the manufacturing operations can be carried out to form a substrate strip including an array of connected embedded component devices, each of which may correspond to an embedded component device such as those illustrated in FIGS. 8-10. As described in FIG. 11R, the array of connected embedded component devices may be singulated into individual embedded component devices such as those illustrated in FIGS. 8-10.

Referring first to FIG. 11A, a carrier 1100 is provided. In one embodiment, the carrier 1100 includes a core layer (not shown) between two carrier conductive layers (not shown) attached to the core layer. Each carrier conductive layer may be formed from a metal, a metal alloy, a matrix with a metal or a metal alloy dispersed therein, or another suitable electrically conductive material. For example, each carrier conductive layer may include a metal foil formed from copper or an alloy including copper. The metal foil may have a thickness in the range from about 10 µm to about 30 µm, such as in the range from about 15 µm to about 25 µm.

The carrier 1100 has an upper surface 1102 and a lower surface 1104. A conductive layer 1105 (conductive sheet 1105) is disposed adjacent to the lower surface 1104. FIGS. 11A to 11H illustrate processing on a single side of the carrier 1100 corresponding to the lower surface 1104. It is contemplated that similar processing may occur on both sides of the carrier 1100, including the side of the carrier 1100 corresponding to the upper surface 1102. For double-sided processing, a conductive layer (not shown) having similar characteristics to the conductive sheet 1105 can be disposed adjacent to the upper surface 1102.

The conductive sheet 1105 may be formed from a metal, a metal alloy, a matrix with a metal or a metal alloy dispersed therein, or another suitable electrically conductive material. For example, the conductive sheet 1105 may include a releasable metal foil formed from copper or an alloy including copper. The conductive sheet 1105 may be attached to the carrier 1100 by a release layer (not shown). In one embodiment, the release layer is an adhesive layer that may be organic or inorganic, such as tape. The tape, which can be implemented as a single-sided or double-sided adhesive tape, secures components at an appropriate spacing with respect to one another, and allows subsequent manufacturing operations to be carried out with those components disposed adjacent to the carrier 1100. The conductive sheet 1105 may have a thickness in the range from about 2 µm to about 10 µm, such as in the range from about 3 µm to about 5 µm.

Next, as illustrated in FIG. 11B, conductive blocks 1106 and the conductive vias 741 are formed adjacent to a lower surface 1107 of the conductive sheet 1105. The process by which the conductive blocks 1106 and the conductive vias 741 are formed is similar to the process previously described with reference to FIGS. 6B through 6D. A photoresist material is formed adjacent to the lower surface 1107. Openings in the photoresist are created, such as by photoimaging and developing, that correspond to the locations of the conductive blocks 1106 and the conductive vias 741. An electrically conductive material is applied into the openings to form the conductive blocks 1106 and the conductive vias 741. The conductive blocks 1106 and the conductive vias 741 may be buffed. The photoresist layer is then stripped to expose the conductive sheet 1105.

Next, as illustrated in FIG. 11C, a dielectric layer 1115 is disposed adjacent to the lower surface 1107 of the conductive sheet 1105. The portion of the dielectric layer 1115 shown in FIG. 11C corresponds to the dielectric layer 715 of FIG. 7. The dielectric layer 1115 may cover a lateral surface 1108 of the conductive blocks 1106. A conductive layer 1110 (conductive sheet 1110) may be disposed adjacent to the dielectric layer 1115, the conductive blocks 1106, and the conductive vias 741. In one embodiment, the dielectric layer 1115 may be formed of a resin material. The conductive sheet 1110, such as a copper foil, may be disposed adjacent to the dielectric layer 1115 to form, for example, a resin-coated copper layer. The conductive sheet 1110 may be a metal such as copper or an alloy including copper. The conductive sheet 1110 may be formed by electroless plating, sputtering, or another suitable method known in the art. The dielectric layer 1115 may have a single resin layer, or may include a first sublayer made of resin and a second sublayer made of reinforced resin, such as resin reinforced with glass fibers and/or Kevlar fibers.

In another embodiment, the dielectric layer 1115 may be formed from a prepreg material, and the conductive sheet 1110 may be disposed adjacent to the dielectric layer 1115. The prepreg material may be disposed adjacent to the conductive sheet 1105, and may be pre-formed to define openings at the locations of the conductive blocks 1106 and the conductive vias 741. The prepreg material may be formed of one prepreg layer, or of two or more prepreg layers. Alternatively, the dielectric layer 1115 may include a combination of a prepreg sublayer and a resin sublayer, and the conductive sheet 1110 may be disposed adjacent to the dielectric layer 1115. The prepreg sublayer may be disposed adjacent to the conductive sheet 1105, and may be pre-formed to define openings at the locations of the conductive blocks 1106 and the conductive vias 741. The resin sublayer may be disposed adjacent to the prepreg sublayer, and may also be disposed adjacent to the conductive sheet 1105 within the openings defined by the prepreg sublayer.

Next, as illustrated in FIG. 11D, a patterned conductive layer 1140 is formed from the conductive sheet 1110, and the conductive vias 742 are formed adjacent to the patterned conductive layer 1140. The portion of the patterned conductive layer 1140 shown in FIG. 11D corresponds to the patterned conductive layer 740 of FIG. 7. The process by which the patterned conductive layer 1140 and the conductive vias 742 are formed has aspects that are similar to the process previously described with reference to FIGS. 6B through 6D. A photoresist material is formed adjacent to the conductive sheet 1110, such as by dry film lamination. Openings in the photoresist are created, such as by photoimaging and developing, that correspond to the patterned conductive layer 1140. An electrically conductive material is applied into the openings to form a conductive layer corresponding to the patterned conductive layer 1140. The photoresist layer is then stripped. Then, a photoresist material is again formed adjacent to the conductive sheet 1110. Openings in the photoresist are created, such as by photoimaging and developing, that correspond to the conductive vias 742. An electrically conductive material is applied into the openings to form the conductive vias 742. The conductive vias 742 may be buffed. The photoresist layer is then stripped. Flash etching is then performed to remove residual portions of the conductive sheet 1110, and to form the patterned conductive layer 1140.

FIG. 11E illustrates an embodiment in which a conductive block 1112 corresponding to the two-layer cavity 1006 of FIG. 10 is formed. The conductive block 1112 includes a first conductive portion 1112a, and a second conductive portion 1112b. The second conductive portion 1112b is formed similarly to how the conductive vias 742 are formed (see description associated with FIG. 11D). In one embodiment, the first conductive portion 1112a has a width 1111 that is greater than a width 1117 of the second conductive portion 1112b. A lateral surface 1113 of the first conductive portion 1112a is covered by the dielectric layer 1115. A lateral surface 1116 of the second conductive portion 1112b is then covered by a dielectric layer (not shown) corresponding to the dielectric layer 260 of FIGS. 2 and 7.

Next, as illustrated in FIG. 11F, a dielectric layer 1160 is disposed adjacent to the dielectric layer 1115 and covering the patterned conductive layer 1140 and the conductive vias 742. The portion of the dielectric layer 1160 shown in FIG. 11F corresponds to the dielectric layer 260 of FIGS. 2 and 7. A conductive layer 1118 (conductive sheet 1118) may be disposed adjacent to the dielectric layer 1160 and the conductive vias 742. The dielectric layer 1160 and the conductive sheet 1118 have similar characteristics to and are formed in a similar manner to the dielectric layer 1115 and the conductive sheet 1110, respectively, and are not described further here (see description associated with FIG. 11C).

Next, as illustrated in FIG. 11G, a patterned conductive layer 1150 is formed from the conductive sheet 1118, and the conductive vias 744 are formed adjacent to the patterned conductive layer 1150. The portion of the patterned conductive layer 1150 shown in FIG. 11G corresponds to the patterned conductive layer 750 of FIG. 7. The patterned conductive layer 1150 and the conductive vias 744 have similar characteristics to and are formed in a similar manner to the patterned conductive layer 1142 and the conductive vias 742, respectively, and are not described further here (see description associated with FIG. 11D).

Next, as illustrated in FIG. 11H, a dielectric layer 1170 is disposed adjacent to the dielectric layer 1160 and covering the patterned conductive layer 1150 and the conductive vias 744. The portion of the dielectric layer 1170 shown in FIG. 11H corresponds to the dielectric layer 270 of FIGS. 2 and 7. A conductive layer 1119 (conductive sheet 1119) may be disposed adjacent to the dielectric layer 1170 and the conductive vias 744. The dielectric layer 1170 and the conductive sheet 1119 have similar characteristics to and are formed in a similar manner to the dielectric layer 1115 and the conductive sheet 1110, respectively, and are not described further here (see description associated with FIG. 11C).

Next, as illustrated in FIG. 11I, the carrier 1100 is removed to expose the conductive sheet 1105.

Next, as illustrated in FIG. 11J, a patterned conductive layer 1130 is formed from the conductive sheet 1105, and the conductive vias 224 are formed adjacent to the patterned conductive layer 1130. The portion of the patterned conductive layer 1130 shown in FIG. 11J corresponds to the patterned conductive layer 230 of FIGS. 2 and 7. The patterned conductive layer 1130 and the conductive vias 224 have similar characteristics to and are formed in a similar manner to the patterned conductive layer 1142 and the conductive vias 742, respectively, and are not described further here (see description associated with FIG. 11D).

Next, as illustrated in FIG. 11K, a photoresist material is formed adjacent to the dielectric layer 1115, and openings are formed in the photoresist, by a process similar to that previously described with reference to FIG. 6B. Openings in the photoresist are created, such as by photoimaging and developing, that expose the conductive blocks 1106.

Next, as illustrated in FIG. 11L, the conductive blocks 1106 are removed to form the openings 704 and 705 extending through the dielectric layer 1115. The openings 704 and 705 each expose the dielectric layer 1160. The opening 704 can also be referred to as the cavity 706 having the cavity bottom 716. The opening 705 can also be referred to as the cavity 707 having the cavity bottom 717. In one embodiment, the conductive blocks 1106 may be removed by chemical etching. An advantage of chemical etching is that many conductive blocks 1106 can be removed simultaneously by the same process step. In another embodiment, instead of etching away the conductive block 1106, the cavity 706 may be formed by laser drilling and/or mechanical drilling through the dielectric layer 1115. These drilling approaches may be more time-consuming that chemical etching, in that cavities are typically formed one at a time using these approaches.

Next, as illustrated in FIG. 11M, the semiconductor device 202 is disposed adjacent to the dielectric layer 1160 (also adjacent to the cavity bottom 716). The adhesive layer 213 may be disposed between the semiconductor device 202 and the cavity bottom 716. The passive electronic component 203 is disposed adjacent to the dielectric layer 1160 (also adjacent to the cavity bottom 717). The adhesive layer 207 may be disposed between the passive electronic component 203 and the cavity bottom 717.

Next, as illustrated in FIG. 11N, a dielectric layer 1114 is disposed adjacent to the dielectric layer 1115, and covering the semiconductor device 202, the passive electronic component 203, and the conductive vias 224. The dielectric layer 1114 may separate a conductive sheet 1120 from the semiconductor device 202, the passive electronic component 203, and the conductive vias 224. The portion of the dielectric layer 1114 shown in FIG. 6G corresponds to the dielectric layer 214 of FIGS. 2 and 7. The dielectric layer 1114 and the conductive sheet 1120 have similar characteristics to and are formed in a similar manner to the dielectric layer 614 and the conductive sheet 616, respectively, and are not described further here (see description associated with FIG. 6G).

Next, as illustrated in FIG. 11O, openings including the openings 221, 222, and 223 are formed. The openings 221 extend through the conductive sheet 1120 and the dielectric layer 1114 to expose the upper surface 233 of each of the conductive vias 224. The openings 222 extend through the conductive sheet 1120 and the dielectric layer 1114 to expose the electrical contacts 212 of the semiconductor device 202. The openings 223 extend through the conductive sheet 1120 and the dielectric layer 1114 to expose the electrical contacts 205 of the passive electronic component 203. The openings 221, 222, and 223 may be formed by laser drilling, or other suitable approaches known in the art.

Next, as illustrated in FIG. 11P, the openings 221, 222, and 223 are filled with a conductive material to form conductive vias, such as the electrical interconnects 225, 226, and 227 of FIGS. 2 and 7. The electrical interconnects 225, 226, and 227 may be formed using any of a number of coating techniques, such as electroless plating and/or electrolytic plating. In one embodiment, a subtractive process is then performed to form a patterned conductive layer 1140. The subtractive process is similar to that described with reference to FIGS. 6J to 6L, and is not further described here. In another embodiment, a modified semi-additive process (MSAP) for forming a patterned conductive layer 1140 including the patterned conductive layer 240 of FIGS. 2 and 7. The MSAP is similar to that described with reference to FIGS. 6M through 6O, and is not further described here. The portion of the patterned conductive layer 1140 shown in FIG. 11P corresponds to the patterned conductive layer 240 of FIGS. 2 and 7.

Next, as illustrated in FIG. 11Q, a dielectric layer 1150 is disposed adjacent to the dielectric layer 1114, and a dielectric layer 1170 is disposed adjacent to the dielectric layer 1160. The portions of the dielectric layers 1150 and 1170 shown in FIG. 11Q correspond to the dielectric layers 250 and 270 of FIGS. 2 and 7, respectively. The dielectric layers 1150 and 1170 may be formed in a manner similar to that described previously for the dielectric layer 614 with reference to FIG. 6G. The electrical interconnects extending through the dielectric layers 1150 and 1170, such as the electrical interconnects 253, may be formed in a manner similar to that described previously for the conductive vias 742 with reference to FIG. 11D. The electrical contacts 254 and 274 may be formed in a manner similar to that described previously for the patterned conductive layer 1140 with reference to FIG. 11P.

Next, as illustrated in FIG. 11R, a dielectric layer 1151 is disposed adjacent to the dielectric layer 1150, and a dielectric layer 1171 is disposed adjacent to the dielectric layer 1170. The portions of the dielectric layers 1151 and 1171 shown in FIG. 11R correspond to the dielectric layers 251 and 271, respectively, of FIGS. 2 and 7. The dielectric layers 1151 and 1171 may be formed in a manner similar to that described previously for the dielectric layer 614 with reference to FIG. 6G. The surface finish layers 255 and 275 may be formed in a manner similar to that described previously for the conductive vias 224 with reference to FIG. 6C. Singulation may then be performed along the dashed lines 1180 and 1181 to obtain individual embedded component devices, such as the embedded component device 700 of FIG. 7.

Next, as illustrated in FIG. 11S, a second semiconductor device 1190 and a passive electronic component 1192 may be electrically connected to the electrical contacts 254.

In the method illustrated in FIGS. 11A through 11S, dielectric layers and conductive elements are formed both above and below the semiconductor device 202. As a result, none of the surfaces of the semiconductor device 202 are exposed at an external surface of the embedded component device 700. In one embodiment, the semiconductor device 202 is covered by the dielectric layer 214. This can provide mechanical stability as well as protect the semiconductor device 202 against oxidation, humidity, and other environmental conditions.

FIG. 12A through FIG. 12E illustrate a method of manufacturing an embedded component device 1280 (see FIG. 12E), according to an embodiment of the invention. For ease of presentation, the following manufacturing operations are described with reference to the method of FIGS. 6A through 6R, with differences noted below. However, it is contemplated that the manufacturing operations can be similarly carried out to form other embedded component devices that may have different internal structure from the embedded component device 1280. It is also contemplated that the manufacturing operations can be carried out to form a substrate strip including an array of connected embedded component devices.

Figure 12A:
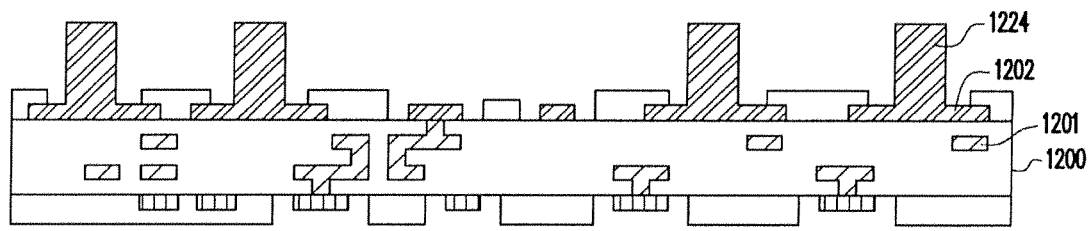
FIG. 12A through FIG. 12E illustrate a method of manufacturing an embedded component device, according to an embodiment of the invention.

Referring to FIG. 12A, a substrate strip 1200 such as a printed circuit board is provided. The substrate strip 1200 includes conductive elements 1201 internal to the substrate 1200, and conductive elements 1202 on the surface of the substrate strip 1200. Conductive vias 1224 extend vertically from the conductive elements 1202. In one embodiment, the conductive vias 1224 have similar characteristics and are formed similarly to the conductive vias 224, as described with reference to FIGS. 6B through 6D.

Figure 12B:
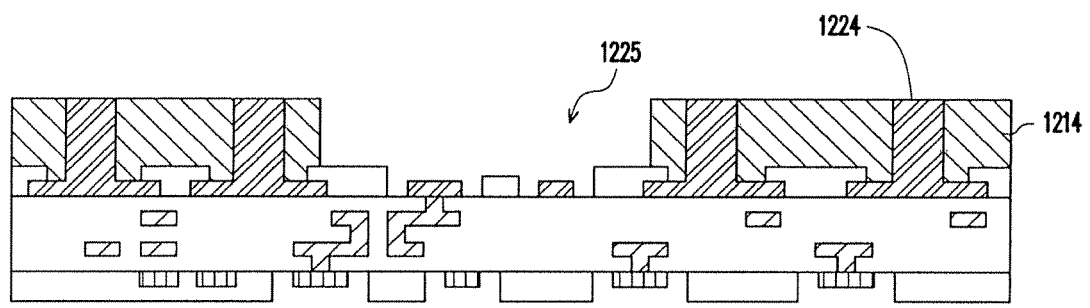

As illustrated in FIG. 12B, a dielectric layer 1214 is disposed adjacent to the substrate strip 1200. The dielectric layer 1214 has similar characteristics to the dielectric layer 614, as described with reference to FIG. 6E. The dielectric layer 1214 is also placed similarly to the dielectric layer 614, as described with reference to FIG. 6G, except that the dielectric layer 1214 is placed on the substrate strip 1200 prior to the placement of a semiconductor device 1202 (see FIG. 12D). The dielectric layer 1214 has a cavity 1225 into which the semiconductor device 1202 is placed (see FIG. 12D). In one embodiment, the dielectric layer 1214 may be ground and/or laser drilled to expose the conductive vias 1224.

Figure 12C:
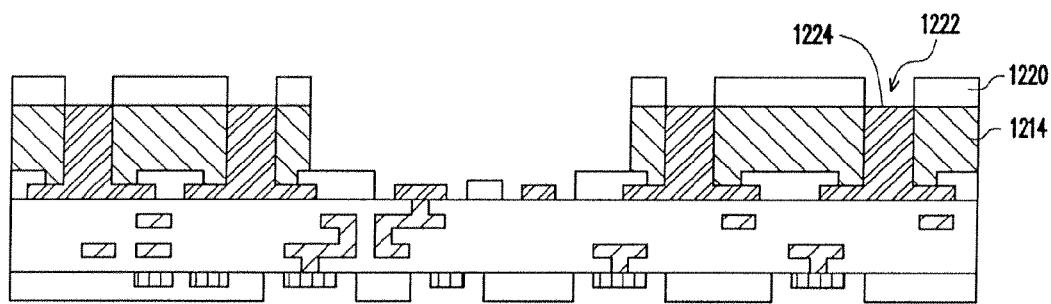

Referring to FIG. 12C, a photoresist layer 1220, such as photo-imageable solder resist, is formed adjacent to the dielectric layer 1214. Predetermined or selected portions of the photoresist layer 1220 may be photoimaged and developed so as to create openings 1222. The openings 1222 expose the conductive vias 1224. The photoresist layer 1220 (and the openings 1222) have similar characteristics and are formed similarly to the photoresist layer 606 (and the openings 607) described with reference to FIG. 6B. In one embodiment, electrical contacts such as solder balls can be disposed in the openings 1222 and electrically connected to the conductive vias 1224. These electrical contacts may provide electrical connectivity to, for example, a patterned conductive layer and/or another package positioned above the photoresist layer 1220.

Figure 12D:
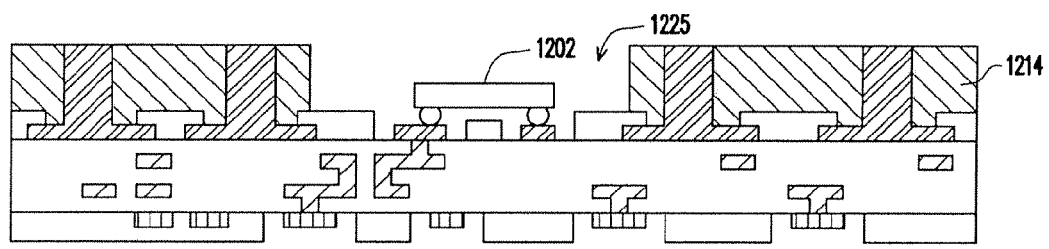
Figure 12E:
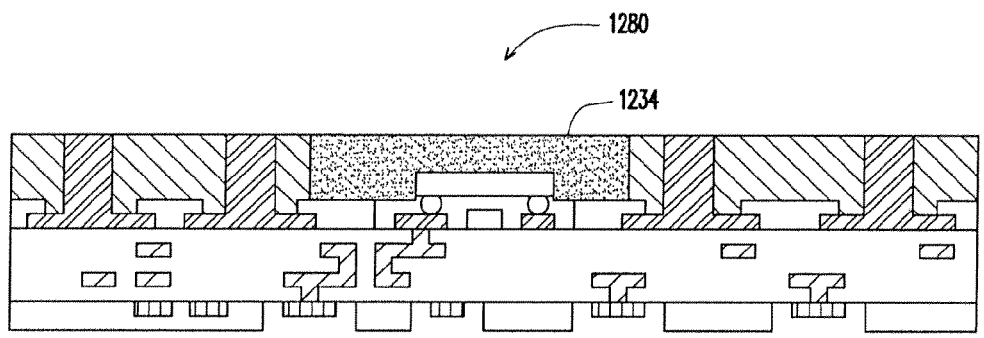

Referring to FIGS. 12D and 12E, the semiconductor device 1202 is placed into the cavity 1225 in the dielectric layer 1214. The cavity 1225 is then filled with a dielectric layer 1234. The dielectric layer 1234 may be epoxy, a molding compound, a liquid molding compound, or another suitable material different from prepreg. In one embodiment, the semiconductor device 1202 may be flip-chip bonded to one or more of the conductive elements 1202. Alternatively, a semiconductor device similar to the semiconductor device 202 (see FIG. 6E) may be disposed adjacent to the substrate strip 1200. In this embodiment, the electrical contacts 212 of the semiconductor device 202 may be exposed as described with reference to FIG. 6H. Also in this embodiment, it is contemplated that the formation of the conductive sheet 616 (see FIG. 6G) and the operations described with reference to FIGS. 6H to 6R may follow the operations associated with FIG. 12E.

In one embodiment, a cavity may be formed in the substrate strip 1200 by mechanical drilling, as described with reference to FIG. 6F. The semiconductor device 1202 may then be at least partially placed in the cavity in the substrate strip 1200. In one embodiment, an adhesive layer similar to the adhesive layer 213 may also be disposed in the cavity.

FIG. 13A through FIG. 13H illustrate a method of manufacturing an embedded component device 1390 (see FIG. 13H), according to an embodiment of the invention. For ease of presentation, the following manufacturing operations are described with reference to portions of the method of FIGS. 6A to 6R and the method of FIGS. 11A to 11S, with differences noted below. However, it is contemplated that the manufacturing operations can be similarly carried out to form other embedded component devices that may have different internal structure from the embedded component device 1390. It is also contemplated that the manufacturing operations can be carried out to form a substrate strip including an array of connected embedded component devices.

Figure 13A:
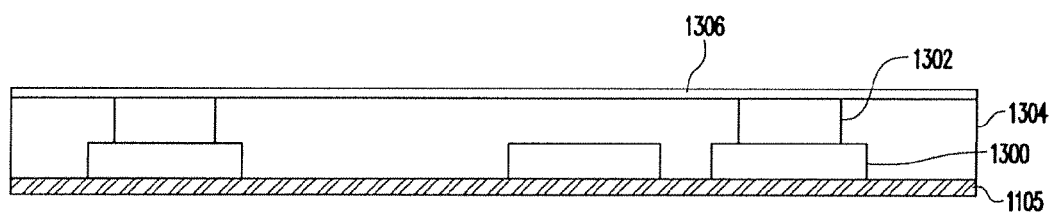
FIG. 13A through FIG. 13H illustrate a method of manufacturing an embedded component device, according to an embodiment of the invention.

Referring to FIG. 13A, a conductive layer 1105 (previously described with reference to FIG. 11A) is provided. In one embodiment, the conductive layer 1105 (conductive sheet 1105) may include a releasable metal foil formed from copper or an alloy including copper. The metal foil may have a thickness in the range from about 10 μm to about 30 μm, such as in the range from about 15 μm to about 25 μm. The conductive sheet 1105 may be disposed adjacent to a carrier (not shown) such as the carrier 1100 illustrated in FIG. 11A. The conductive sheet 1105 may be attached to the carrier 1100 by a release layer (not shown). In one embodiment, the release layer is an adhesive layer that may be organic or inorganic, such as tape.

A patterned conductive layer 1300 may be disposed adjacent to the conductive sheet 1105, and conductive vias 1302 may extend vertically from the patterned conductive layer 1300. The patterned conductive layer 1300 may have similar characteristics to the patterned conductive layer 1140 previously described with reference to FIG. 11D. The conductive vias 1302 may have similar characteristics to the patterned conductive layer 742, also previously described with reference to FIG. 11D. The process by which the patterned conductive layer 1300 and the conductive vias 1302 are formed has aspects that are similar to the process previously described with reference to FIG. 11D. A photoresist material is formed adjacent to the conductive sheet 1105, such as by dry film lamination. Openings in the photoresist are created, such as by photoimaging and developing, that correspond to the patterned conductive layer 1300. An electrically conductive material is applied into the openings to form a conductive layer corresponding to the patterned conductive layer 1300. The photoresist layer is then stripped. Then, a photoresist material is again formed adjacent to the conductive sheet 1105. Openings in the photoresist are created, such as by photoimaging and developing, that correspond to the conductive vias 1302. An electrically conductive material is applied into the openings to form the conductive vias 1302. The conductive vias 1302 may be buffed. The photoresist layer is then stripped.

In one embodiment, after stripping of the photoresist layer, a dielectric sublayer 1304 is disposed adjacent to the conductive sheet 1105. The dielectric sublayer 1304 has similar characteristics to the dielectric layer 1115 previously described with reference to FIG. 11C. In one embodiment, the dielectric sublayer 1304 may be formed of a resin material. The conductive sheet 1105 may be disposed adjacent to the dielectric sublayer 1304 to form, for example, a resin-coated copper layer. The dielectric sublayer 1304 may have a single resin layer, or may include a first sublayer made of resin and a second sublayer made of reinforced resin, such as resin reinforced with glass fibers and/or Kevlar fibers. Alternatively, the dielectric sublayer 1304 may be formed from a prepreg material. The prepreg material may be pre-formed to define openings at the locations of the conductive vias 1302. The dielectric sublayer 1304 may also include a combination of a prepreg sublayer and a resin sublayer. In this embodiment, after forming the dielectric sublayer 1304 adjacent to the conductive sheet 1105, a conductive sheet 1306 is formed adjacent to the dielectric sublayer 1304. The conductive sheet 1306 has similar characteristics to and is formed similarly to the conductive sheet 1110 previously described with reference to FIG. 11C. The conductive sheet 1306 may be a metal such as copper or an alloy including copper. The conductive sheet 1306 may be formed by electroless plating, sputtering, or another suitable method known in the art.

Alternatively, the conductive sheet 1306 may be attached to the dielectric sublayer 1304 prior to disposing the dielectric sublayer 1304 adjacent to the conductive sheet 1105. In one embodiment, the dielectric sublayer 1304, with the conductive sheet 1306 already attached, may be disposed adjacent to the conductive sheet 1105. This may occur simultaneously with the conductive sheet 1306 being disposed adjacent to the conductive vias 1302.

Figure 13B:
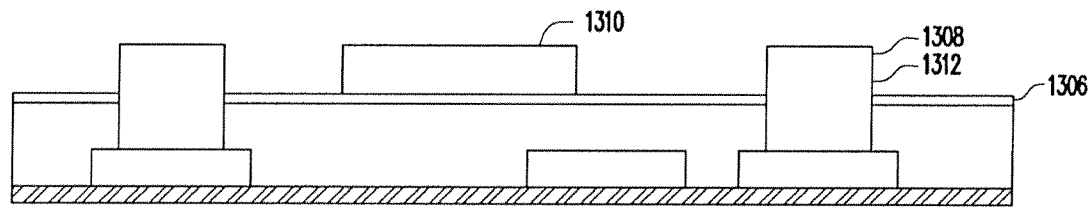

As illustrated in FIG. 13B, conductive vias 1308 and conductive block 1310 are formed adjacent to the conductive sheet 1306. The conductive vias 1308 extend the conductive vias 1302 (see FIG. 13A) to form conductive vias 1312. The conductive vias 1312 and the conductive block 1310 have similar characteristics to and are formed similarly to the conductive vias 741 and the conductive blocks 1106 previously described with reference to FIG. 11B. A photoresist material is formed adjacent to the conductive sheet 1306. Openings in the photoresist are created, such as by photoimaging and developing, that correspond to the locations of the conductive block 1310 and the conductive vias 1312. An electrically conductive material is applied into the openings to form the conductive block 1310 and the conductive vias 1312. The conductive block 1310 and the conductive vias 1312 may be buffed. The photoresist layer is then stripped to expose the conductive sheet 1306.

Figure 13C:
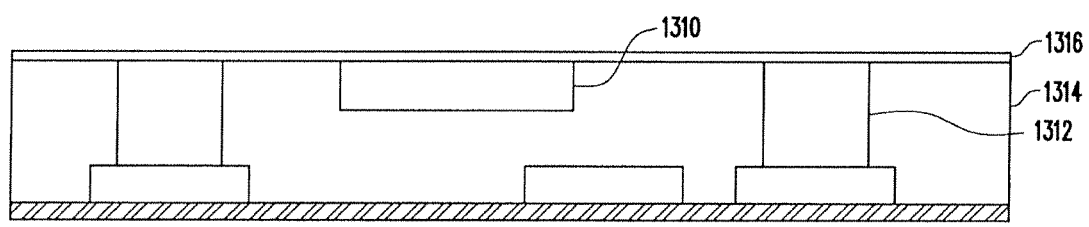

As illustrated in FIG. 13C, the conductive sheet 1306 is then removed by flash etching. An additional dielectric sublayer having similar characteristics to the dielectric layer 1115 previously described with reference to FIG. 11C is disposed adjacent to the dielectric sublayer 1304 (see FIG. 13A) to form the dielectric layer 1314. The conductive block 1310 and the conductive vias 1312 may be buffed and de-smeared. A conductive sheet 1316 may then be formed adjacent to the dielectric layer 1314. The conductive sheet 1316 has similar characteristics to and is formed similarly to the conductive sheet 1306 previously described with reference to FIG. 13A. Alternatively, the conductive sheet 1316 may be attached to the additional dielectric sublayer prior to disposing the additional dielectric sublayer adjacent to the dielectric sublayer 1304 to form the dielectric layer 1314. In one embodiment, the additional dielectric sublayer, with the conductive sheet 1316 already attached, may be disposed adjacent to the dielectric layer 1304 to form the dielectric layer 1314. This may occur simultaneously with the conductive sheet 1316 being disposed adjacent to the conductive vias 1312.

Figure 13D:
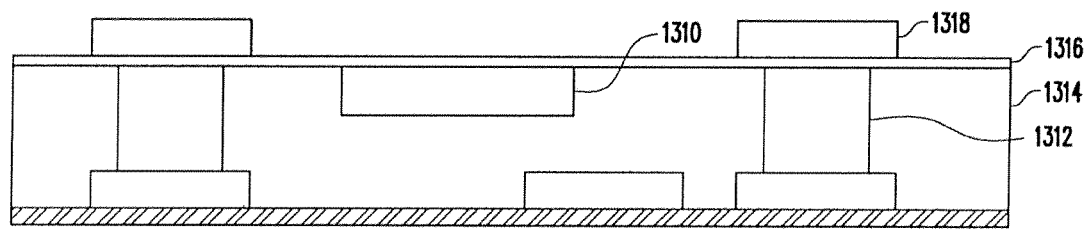

As illustrated in FIG. 13D, a patterned conductive layer 1318 is then disposed adjacent to the conductive sheet 1316. The patterned conductive layer 1318 may have similar characteristics to and be formed in a similar manner to the patterned conductive layer 1300 previously described with reference to FIG. 13A.

Figure 13E:
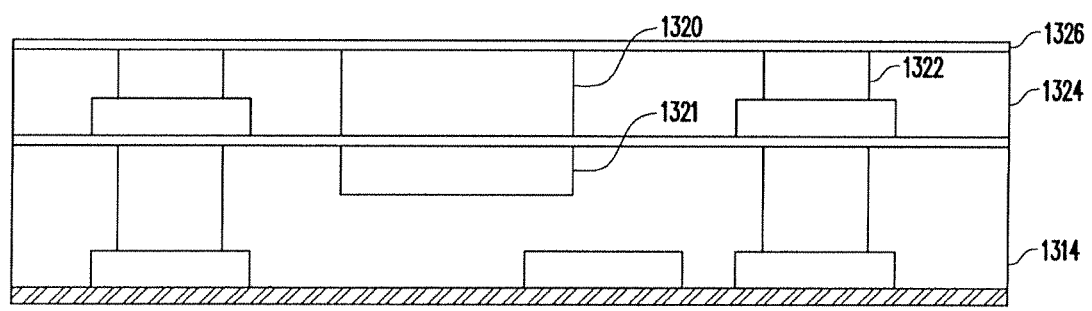

As illustrated in FIG. 13E, conductive vias 1322 are formed adjacent to the patterned conductive layer 1318, and conductive block 1320 is formed adjacent to the conductive sheet 1316. The conductive block 1320 extends the conductive block 1310 (see FIG. 13C) to form conductive block 1321. The conductive vias 1322 and the conductive block 1321 have similar characteristics to and are formed similarly to the conductive vias 1312 and the conductive blocks 1310 previously described with reference to FIG. 13B. The conductive sheet 1316 is then removed by flash etching. An additional dielectric sublayer 1324 having similar characteristics to the dielectric layer 1115 previously described with reference to FIG. 11C is disposed adjacent to the dielectric layer 1314. The conductive block 1321 and the conductive vias 1312 may be buffed and de-smeared. A conductive sheet 1326 may then be formed adjacent to the dielectric sublayer 1324. The conductive sheet 1326 has similar characteristics to and is formed similarly to the conductive sheet 1306 previously described with reference to FIG. 13A. Alternatively, the conductive sheet 1326 may be attached to the dielectric sublayer 1324 prior to disposing the dielectric sublayer 1324 adjacent to the dielectric layer 1314. In one embodiment, the dielectric sublayer 1324, with the conductive sheet 1326 already attached, may be disposed adjacent to the dielectric layer 1314. This may occur simultaneously with the conductive sheet 1326 being disposed adjacent to the conductive vias 1322.

Figure 13F:
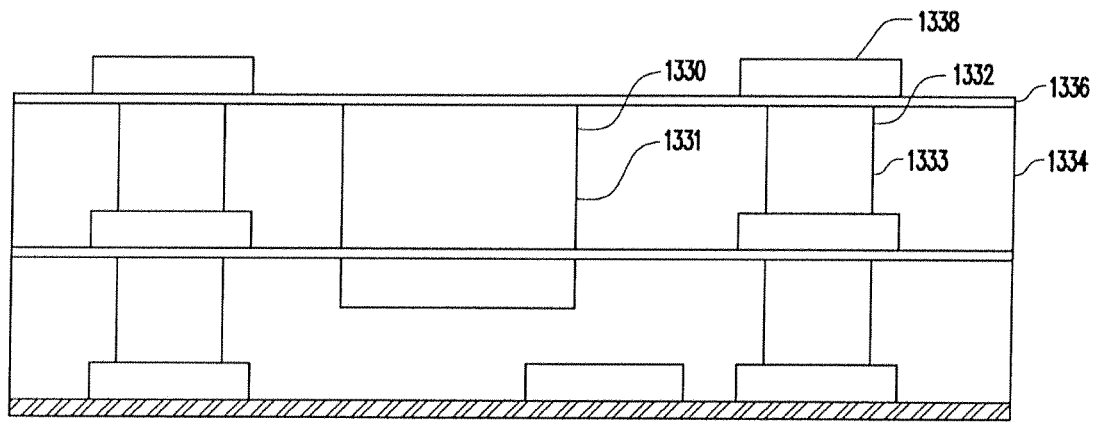

As illustrated in FIG. 13F, conductive vias 1332 are formed adjacent to the conductive sheet 1326, and conductive block 1330 is formed adjacent to the conductive sheet 1326. The conductive vias 1332 extend the conductive vias 1322 (see FIG. 13E) to from the conductive vias 1333. The conductive block 1330 extends the conductive block 1321 (see FIG. 13E) to form conductive block 1331. The conductive vias 1333 and the conductive block 1331 have similar characteristics to and are formed similarly to the conductive vias 1312 and the conductive blocks 1310 previously described with reference to FIG. 13B. The conductive sheet 1326 is then removed by flash etching. An additional dielectric layer having similar characteristics to the dielectric layer 1115 previously described with reference to FIG. 11C is disposed adjacent to the dielectric sublayer 1324 (see FIG. 13E) to form the dielectric layer 1334. The conductive block 1331 and the conductive vias 1333 may be buffed and de-smeared. A conductive sheet 1336 may then be formed adjacent to the dielectric layer 1334. The conductive sheet 1336 has similar characteristics to and is formed similarly to the conductive sheet 1306 previously described with reference to FIG. 13A. Alternatively, the conductive sheet 1336 may be attached to the additional dielectric sublayer prior to disposing the additional dielectric sublayer adjacent to the dielectric sublayer 1324 to form the dielectric layer 1334. In one embodiment, the additional dielectric sublayer, with the conductive sheet 1336 already attached, may be disposed adjacent to the dielectric layer 1324 to form the dielectric layer 1334. This may occur simultaneously with the conductive sheet 1336 being disposed adjacent to the conductive vias 1332.

A patterned conductive layer 1338 is then disposed adjacent to the conductive sheet 1336. The patterned conductive layer 1338 may have similar characteristics to and be formed in a similar manner to the patterned conductive layer 1300 previously described with reference to FIG. 13A.

Figure 13G:
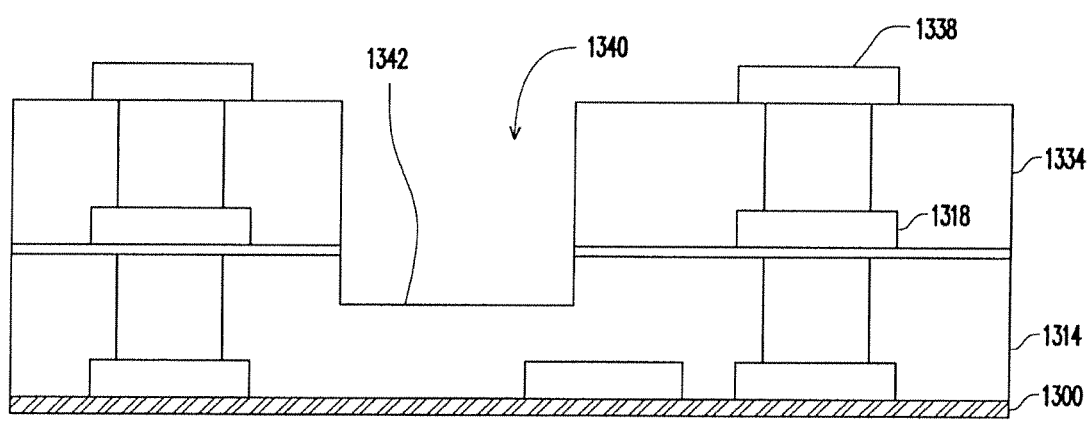

As illustrated in FIG. 13G, the conductive sheet 1336 may be removed by flash etching. A photoresist material is then formed adjacent to the dielectric layer 1334, and openings are formed in the photoresist, by a process similar to that previously described with reference to FIG. 11K. Openings in the photoresist are created, such as by photoimaging and developing, that expose the conductive blocks 1331 (see FIG. 13F). The conductive blocks 1331 are removed to form the opening 1340 extending through the dielectric layer 1334 into the dielectric layer 1314. The opening 1340 can also be referred to as the cavity 1340 having cavity bottom 1342. In one embodiment, the conductive blocks 1331 may be removed by chemical etching. An advantage of chemical etching is that many conductive blocks 1331 can be removed simultaneously by the same process step. In another embodiment, instead of etching away the conductive block 1331, the cavity 1340 may be formed by laser drilling and/or mechanical drilling through the dielectric layer 1331. These drilling approaches may be more time-consuming that chemical etching, in that cavities are typically formed one at a time using these approaches.

Figure 13H:
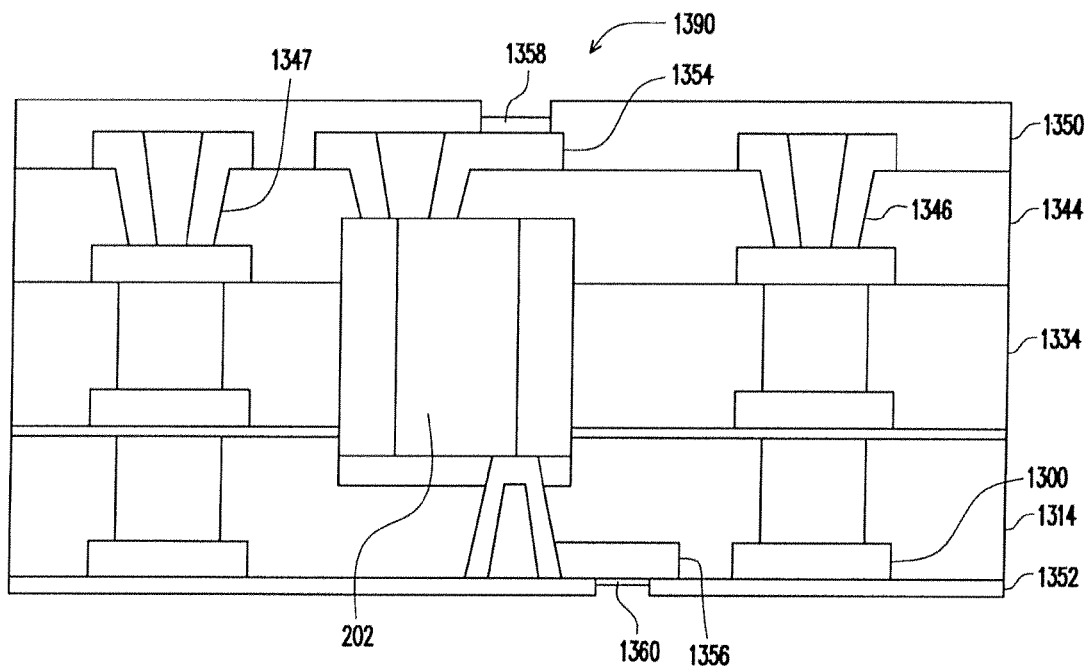

FIG. 13H illustrates the embedded component device 1390. The die 202 is disposed in the cavity 1340. A dielectric layer 1344 is formed adjacent to the dielectric layer 1334. The dielectric layer 1344 has similar characteristics to the dielectric layer 1115 previously described with reference to FIG. 11C. The patterned conductive layer 1346 may be formed in a similar manner to that previously described with references to FIGS. 11N through 11P. In one embodiment, a subtractive process similar to that described with reference to FIGS. 6J to 6L may be used, and is not further described here. In another embodiment, a modified semi-additive process (MSAP) similar to that described with reference to FIGS. 6M through 6O may be used, and is not further described here.

Alternatively, the patterned conductive layer 1346 may be formed by first forming openings 1347 in the dielectric layer 1344, then by disposing a layer of conductive material in the openings 1347. The openings 1347 may be formed by mechanical drilling, or another suitable method known in the art. The conductive layer may be disposed in the openings 1347 by sputtering, electroless plating, or another suitable method known in the art. The conductive layer may then be patterned to form the patterned conductive layer 1346. The patterned conductive layer 1346 may have similar characteristics to and be formed in a similar manner to the patterned conductive layer 1300 previously described with reference to FIG. 13A.

Dielectric layers 1350 and 1352 may then be disposed adjacent to the patterned conductive layers 1346 and 1300, respectively. The dielectric layers 1350 and 1352 may be made of solder mask. Portions of the patterned conductive layers 1346 and 1300 may be exposed by the dielectric layers 1350 and 1352 to form electrical contacts 1354 and 1356 on an external periphery of the embedded component device 1390. The electrical contacts 1354 and 1356 may have surface finish layers 1358 and 1360, respectively, that may include one or more sublayers of nickel and gold.

FIG. 13A through FIG. 13H show a method of forming a cavity that extends across more than one patterned conductive layer in an embedded component device. In particular, the cavity 1340 extends from the patterned conductive layer 1338 past the conductive layer 1318. In one embodiment, the cavity bottom 1342 may be positioned between the patterned conductive layer 1318 and the patterned conductive layer 1300 in the dielectric layer 1314. The cavity bottom 1342 can be positioned between the patterned conductive layer 1300 and the patterned conductive layer 1318 by depositing the conductive block 1310 and the conductive vias 1308 adjacent to the conductive sheet 1306 without also forming a separate patterned conductive layer adjacent to the conductive sheet 1306. Alternatively, the cavity bottom 1342 could be positioned at the depth of a patterned conductive layer by, for example, also forming a separate patterned conductive layer adjacent to the conductive sheet 1306. In one embodiment, the cavity 1340 can extend past the patterned conductive layer 1318 by forming the conductive block 1321 as shown in FIGS. 13D and 13E. The cavity 1340 can be formed to have a depth corresponding to the die 202 (see FIG. 13H) disposed in the cavity 1340 based on the positioning of the conductive sheet 1306 (see FIG. 13B) and the conductive sheet 1336 (see FIG. 13F). In the illustrated example, the depth of the cavity 1340 is greater than a thickness of the dielectric layer 1334.

Figure 14A:
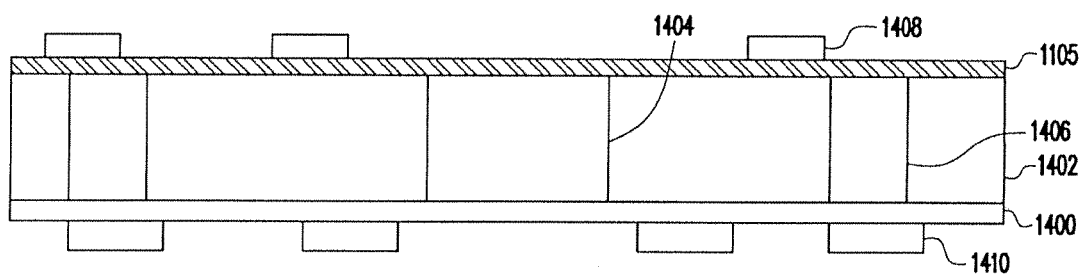
FIG. 14A through FIG. 14C illustrate a method of manufacturing an embedded component device, according to an embodiment of the invention.
Figure 14B:
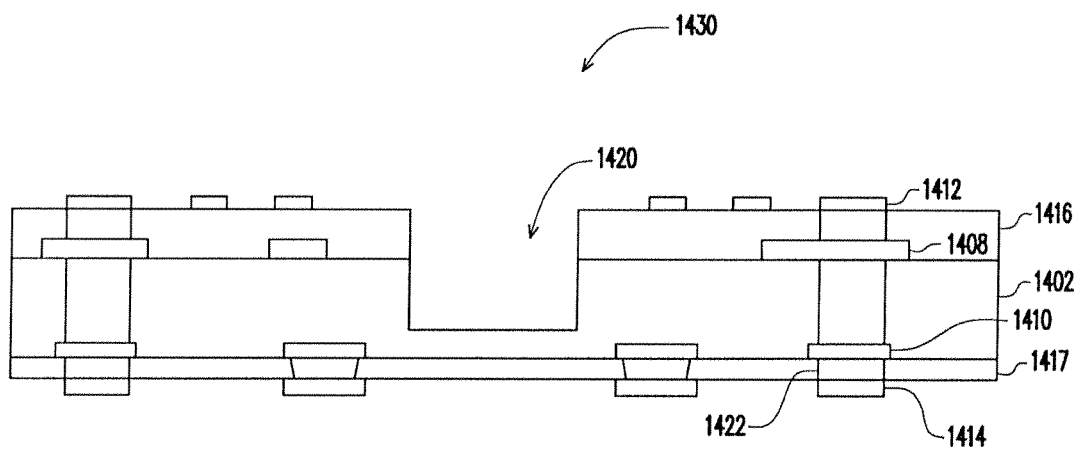
Figure 14C:
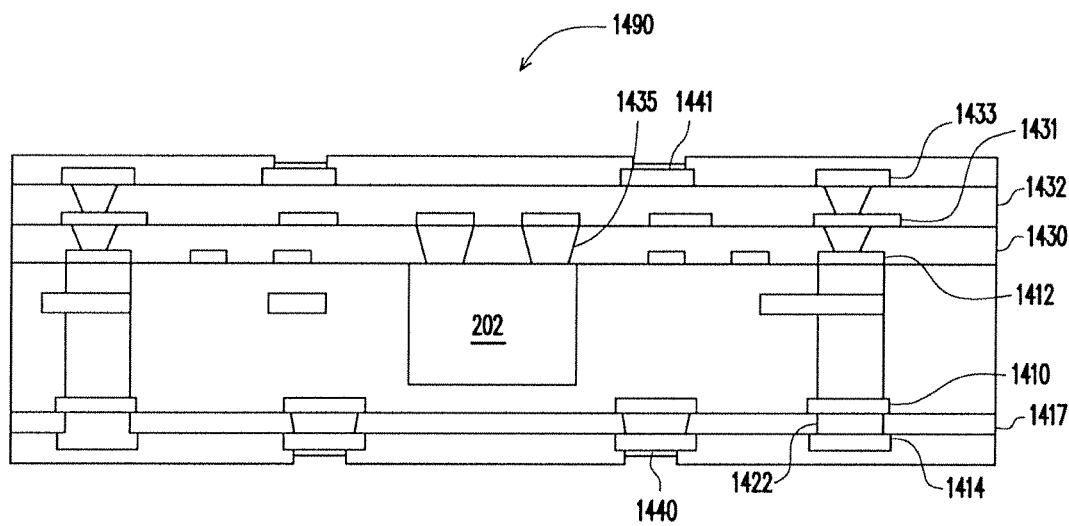

FIG. 14A through FIG. 14C illustrate a method of manufacturing an embedded component device 1490 (see FIG. 14C), according to an embodiment of the invention. For ease of presentation, the following manufacturing operations are described with reference to portions of the method of FIGS. 11A to 11S and the method of FIGS. 13A to 13H, with differences noted below. However, it is contemplated that the manufacturing operations can be similarly carried out to form other embedded component devices that may have different internal structure from the embedded component device 1490. It is also contemplated that the manufacturing operations can be carried out to form a substrate strip including an array of connected embedded component devices.

Referring to FIG. 14A, a conductive layer 1105 (previously described with reference to FIG. 11A) is provided. In one embodiment, the conductive layer 1105 (conductive sheet 1105) may include a releasable metal foil formed from copper or an alloy including copper. The conductive sheet 1105 may be disposed adjacent to a carrier (not shown) such as the carrier 1100 illustrated in FIG. 11A. The conductive sheet 1105 may be attached to the carrier 1100 by a release layer (not shown).

Conductive vias 1406 and conductive block 1404 are formed adjacent to the conductive sheet 1105. The conductive vias 1406 and the conductive block 1404 have similar characteristics to and are formed similarly to the conductive vias 741 and the conductive blocks 1106 previously described with reference to FIG. 11B. A photoresist material is formed adjacent to the conductive sheet 1105. Openings in the photoresist are created, such as by photoimaging and developing, that correspond to the locations of the conductive block 1404 and the conductive vias 1406. An electrically conductive material is applied into the openings to form the conductive block 1404 and the conductive vias 1406. The conductive block 1404 and the conductive vias 1406 may be buffed. The photoresist layer is then stripped to expose the conductive sheet 1105.

A dielectric layer 1402 having similar characteristics to the dielectric layer 1115 previously described with reference to FIG. 11C is then disposed adjacent to the conductive sheet 1105. The conductive block 1404 and the conductive vias 1406 may then be buffed and de-smeared. A conductive sheet 1400 may then be formed adjacent to the dielectric layer 1402. The conductive sheet 1400 has similar characteristics to and is formed similarly to the conductive sheet 1105.

A patterned conductive layer 1410 may then be disposed adjacent to the conductive sheet 1400. The patterned conductive layer 1410 may have similar characteristics to the patterned conductive layer 1140 previously described with reference to FIG. 11D. The process by which the patterned conductive layer 1410 is formed is similar to the process previously described for forming the patterned conductive layer 1300 with reference to FIG. 13A.

In one embodiment, the conductive sheet 1105 may then be detached from the carrier and flipped over so that the patterned conductive layer 1410 may be placed on the carrier. A patterned conductive layer 1408 may then be disposed adjacent to the conductive sheet 1105. The patterned conductive layer may have similar characteristics and may be formed similarly to the patterned conductive layer 1410.

Alternatively, additional processing may be performed before the conductive sheet 1105 is detached from the carrier. For example, the dielectric layer 1417, the conductive vias 1422, and the patterned conductive layer 1414 (see FIG. 14B) may be formed adjacent to and/or above the patterned conductive layer 1410, similar to processing shown in FIGS. 11D, 11F, and 11G.

As illustrated in FIG. 14B, after the conductive sheet 1105 is detached from the carrier and flipped over, processing similar to that shown in FIGS. 13E, 13F, and 13G may be performed to obtain the structure 1430. The structure 1430 may include a cavity 1420 that extends through dielectric layers 1416 and 1402 and that exposes dielectric layer 1417. The cavity 1420 may also extend from patterned conductive layer 1412 past patterned conductive layer 1408 to the patterned conductive layer 1410.

As illustrated in FIG. 14C, additional processing similar to that shown in FIGS. 11M through 11R may be performed to obtain the embedded component device 1490. This processing results in the semiconductor device 202 being disposed internally to the embedded component device 1490 such that the semiconductor device 202 is positioned between two internal patterned conductive layers: the patterned conductive layer 1412 and the patterned conductive layer 1410. In one embodiment, at least the dielectric layer 1417 separates the patterned conductive layer 1410 from a patterned conductive layer 1414 adjacent to an external periphery 1440 of the embedded component device 1490. In one embodiment, at least a dielectric layer 1430, a patterned conductive layer 1431, and a dielectric layer 1432 separates the patterned conductive layer 1412 from a patterned conductive layer 1433 adjacent to an external periphery 1441 of the embedded component device 1490. The semiconductor device is electrically connected to the patterned conductive layer 1431 through electrical interconnects 1435.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale, and manufacturing tolerances may result in departure from the artistic renditions herein. There may be other embodiments of the present invention which are not specifically illustrated. Thus, the specification and the drawings are to be regarded as illustrative rather than restrictive. Additionally, the drawings illustrating the embodiments of the present invention may focus on certain major characteristic features for clarity. Furthermore, modifications may be made to adapt a particular situation, material, composition of matter, method, or process to the objective, spirit and scope of the invention. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. An embedded component device, comprising:
  an electronic component including an electrical contact;
  an upper patterned conductive layer;
  a single dielectric layer between the upper patterned conductive layer and the electronic component, the dielectric layer having a first opening exposing the electrical contact;

a first electrical interconnect extending from the electrical contact to the upper patterned conductive layer, wherein the first electrical interconnect fills the first opening;

a lower patterned conductive layer embedded in the dielectric layer, the dielectric layer having a second opening extending from the lower patterned conductive layer to the upper patterned conductive layer, the second opening having an upper portion exposing the upper patterned conductive layer and a lower portion exposing the lower patterned conductive layer;

a conductive via located at the lower portion of the second opening; and a second electrical interconnect filling the upper portion of the second opening;

wherein the second electrical interconnect includes a top surface having a first area, and includes a bottom surface having a second area, and the first area is different from the second area; and wherein the conductive via includes an upper surface having a third area substantially parallel to the second area, and the third area is larger than the second area.

2. The embedded component device of claim 1, wherein the upper patterned conductive layer is electrically connected to the lower patterned conductive layer on a conductive path including the conductive via and the second electrical interconnect.

3. The embedded component device of claim 1, wherein the conductive via is a plated conductive post.

4. The embedded component device of claim 1, wherein a first distance from the upper surface of the conductive via to the upper patterned conductive layer is less than a second distance from an upper surface of the electronic component to the upper patterned conductive layer.

5. The embedded component device of claim 1, wherein the electronic component is at least one of an active component and a passive component.

6. The embedded component device of claim 1, wherein the dielectric layer includes at least one of a prepreg layer, a resin layer, and an epoxy layer.

7. The embedded component device of claim 6, wherein the dielectric layer includes fiber, and portions of the fiber are oriented away from the lower patterned conductive layer.

8. The embedded component device of claim 1, wherein the electronic component has a back surface, the back surface being disposed adjacent to the lower patterned conductive layer.

9. The embedded component device of claim 1, wherein the upper surface of the conductive via is substantially coplanar with an active surface of the electronic component.

10. An embedded component device, comprising:
a upper patterned conductive layer;
a lower patterned conductive layer;
an electronic component electrically connected to at least one of the upper patterned conductive layer and the lower patterned conductive layer;
a single dielectric layer between the upper patterned conductive layer and the lower patterned conductive layer and encapsulating the electronic component, the dielectric layer defining an opening extending from the lower patterned conductive layer to the upper patterned conductive layer, the lower patterned conductive layer embedded in the single dielectric layer;

a conductive via located at a lower portion of the opening and electrically connected to the lower patterned conductive layer; and an electrical interconnect located at an upper portion of the opening and electrically connected to the upper patterned conductive layer;

wherein the electrical interconnect includes a top surface having a first area, and includes a bottom surface having a second area, and the first area is different from the second area; and wherein the conductive via includes an upper surface having a third area substantially parallel to the second area, and the third area is larger than the second area.

11. The embedded component device of claim 10, wherein the upper patterned conductive layer is electrically connected to the lower patterned conductive layer on a conductive path including the conductive via and the electrical interconnect.

12. The embedded component device of claim 10, wherein the conductive via is a conductive post.

13. The embedded component device of claim 10, wherein the first area is larger than the second area.

14. An embedded component device, comprising:
a first dielectric layer defining a cavity;
a lower patterned conductive layer disposed over the first dielectric layer;
an electronic component disposed in the cavity defined by the first dielectric layer;
a second dielectric layer encapsulating the electronic component, the second dielectric layer defining an opening extending through the second dielectric layer, the lower patterned conductive layer embedded in the second dielectric layer;
an upper patterned conductive layer disposed over the second dielectric layer;
a conductive via located at a lower portion of the opening and electrically connected to the lower patterned conductive layer; and
an electrical interconnect located at an upper portion of the opening and electrically connected to the upper patterned conductive layer;
wherein the electrical interconnect includes a top surface having a first area, and includes a bottom surface having a second area, and the first area is different from the second area; and
wherein the conductive via includes an upper surface having a third area substantially parallel to the second area, and the third area is larger than the second area.

15. The embedded component device of claim 14, wherein an upper surface of the electronic component is recessed below an upper surface of the second dielectric layer.

16. The embedded component device of claim 14, wherein an active surface of the electronic component faces the upper patterned conductive layer.

* * * * *